(12) United States Patent
Noda et al.

(10) Patent No.: US 8,633,473 B2
(45) Date of Patent: Jan. 21, 2014

(54) HIGH CONTRAST LIGHT EMITTING DEVICE AND METHOD FOR MANUFACTURING THE SAME

(75) Inventors: Takeshi Noda, Kanagawa (JP); Masayuki Sakakura, Kanagawa (JP); Yasuyuki Arai, Kanagawa (JP); Yuko Tachimura, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 11/318,783

(22) Filed: Dec. 27, 2005

(65) Prior Publication Data

US 2006/0163597 A1 Jul. 27, 2006

(30) Foreign Application Priority Data

Dec. 28, 2004 (JP) ................. 2004-380774

(51) Int. Cl.
- H01L 29/08 (2006.01)
- H01L 35/24 (2006.01)
- H01L 51/00 (2006.01)

(52) U.S. Cl.
USPC 257/40; 257/98; 257/E33.068; 257/E51.018; 257/E51.024

(58) Field of Classification Search
USPC ............ 257/40, 87, E51.012, E51.018, 257/E51.021; 313/498, 504, 506
See application file for complete search history.

(56) References Cited

U.S. PATENT DOCUMENTS

| | | | |
|---|---|---|---|
| 5,837,391 A | 11/1998 | Utsugi | |
| 6,013,384 A | 1/2000 | Kido et al. | |
| 6,091,195 A | 7/2000 | Forrest et al. | |
| 6,384,529 B2 | 5/2002 | Tang et al. | |
| 6,445,005 B1 | 9/2002 | Yamazaki et al. | |
| 6,454,966 B1 | 9/2002 | Kobayashi et al. | |
| 6,541,130 B2 | 4/2003 | Fukuda | |
| 6,589,673 B1 | 7/2003 | Kido et al. | |

(Continued)

FOREIGN PATENT DOCUMENTS

| | | |
|---|---|---|
| EP | 0855848 | 7/1998 |
| EP | 1 154 676 A1 | 11/2001 |

(Continued)

OTHER PUBLICATIONS

Nakada, T. at al., "Multi Photon Emission Organic EL Devices Using Charge-Transfer Complex as Charge Generation Layer," 27a-ZL-12, The 63rd Applied Physics-related Combined Seminar, Seminar Proceedings, Sep. 1, 2002, p. 1165 (with English transtation).

(Continued)

*Primary Examiner* — Jarrett Stark
(74) *Attorney, Agent, or Firm* — Husch Blackwell LLP

(57) ABSTRACT

It is an object of the present invention to provide a high-contrast light-emitting device without using a polarization plate. In particular, it is an object of the present invention to make contrast control simpler for a light-emitting device provided with a color filter.

A light-emitting device according to the present invention has a feature of having a structure for reducing reflection of light from a light-emitting later at a reflective electrode, and further, has a feature of absorbing wavelengths other than the light by a color filter to enhance the contrast. Accordingly, contrast control can be performed in consideration of only a luminescence component from the light-emitting layer, and is thus made simpler.

26 Claims, 13 Drawing Sheets

(56) References Cited

U.S. PATENT DOCUMENTS

| | | | |
|---|---|---|---|
| 6,894,312 | B2 | 5/2005 | Yamazaki et al. |
| 7,049,741 | B2 * | 5/2006 | Madathil et al. ............... 313/504 |
| 7,059,928 | B2 | 6/2006 | Ikeda |
| 7,102,282 | B1 | 9/2006 | Yamada et al. |
| 7,129,634 | B2 * | 10/2006 | Boroson et al. ............... 313/504 |
| 7,218,049 | B2 | 5/2007 | Yamada et al. |
| 7,416,464 | B2 | 8/2008 | Ikeda |
| 7,710,025 | B2 | 5/2010 | Yamada et al. |
| 7,732,808 | B2 | 6/2010 | Ikeda et al. |
| 2003/0044639 | A1 | 3/2003 | Fukuda |
| 2004/0156405 | A1 | 8/2004 | Asai et al. |
| 2004/0160154 | A1 | 8/2004 | Nishimura et al. ........... 313/113 |
| 2005/0007014 | A1 * | 1/2005 | Kurata ......................... 313/504 |
| 2005/0012445 | A1 | 1/2005 | Yamazaki et al. |
| 2005/0062057 | A1 | 3/2005 | Yamazaki et al. |
| 2005/0098207 | A1 | 5/2005 | Matsumoto et al. |
| 2005/0162092 | A1 | 7/2005 | Yamazaki et al. |
| 2005/0269944 | A1 * | 12/2005 | Su et al. ........................ 313/504 |
| 2006/0180826 | A1 | 8/2006 | Yamazaki et al. |
| 2006/0202610 | A1 * | 9/2006 | Karasawa et al. ............. 313/498 |
| 2007/0029548 | A1 | 2/2007 | Yamazaki et al. |
| 2007/0131948 | A1 | 6/2007 | Seo et al. |
| 2007/0228943 | A1 * | 10/2007 | Yamada et al. ............... 313/504 |

FOREIGN PATENT DOCUMENTS

| | | |
|---|---|---|
| EP | 1 424 732 A2 | 6/2004 |
| EP | 1530245 | 5/2005 |
| EP | 2 154 737 A2 | 2/2010 |
| EP | 2 169 738 A2 | 3/2010 |
| JP | 10-270172 | 10/1998 |
| JP | 2000-323277 | 11/2000 |
| JP | 2001-244079 | 9/2001 |
| JP | 2002-056973 | 2/2002 |
| JP | 2002-367784 | 12/2002 |
| JP | 2003-142277 | 5/2003 |
| JP | 2004-119201 | 4/2004 |
| JP | 2004-164890 | 6/2004 |
| JP | 2004-178930 | 6/2004 |
| JP | 2004- 178930 | 6/2004 |
| JP | 2004-247137 | 9/2004 |
| JP | 2004-355975 | 12/2004 |
| JP | 2005-093396 | 4/2005 |
| JP | 2005-156871 | 6/2005 |
| JP | 2005-166637 | 6/2005 |
| JP | 2005-302313 | 10/2005 |
| WO | WO 01/39554 A1 | 5/2001 |
| WO | WO 2004/064453 A1 | 7/2004 |
| WO | WO 2005/031798 A2 | 4/2005 |

OTHER PUBLICATIONS

International Search Report (Application No. PCT/JP2005/018062) Dated Jan. 17, 2006.

Written Opinion (Application No. PCT/JP2005/018062) Dated Jan. 17, 2008.

Ho, K.S. et al., "Fabrication and Characterization of Metal Oxide Nanoparticles/Hole Transporting Polymer Composites," Polymer Preprints Japan, vol. 49, No. 10, Sep. 8, 2000, pp. 3199-3200, Society of Polymer Science, Japan (with full English translation, pp. 1-3).

Nakada, T. et al., "Multi Photon Emission Organic EL Devices Using Charge-Transfer Complex as Charge Generation Layer," 27a-ZL-12, The 63rd Applied Physics-related Combined Seminar, Seminar Proceedings, Sep. 1, 2002, p. 1165 (with English translation).

* cited by examiner

HIGH CONTRAST LIGHT EMITTING DEVICE AND METHOD FOR MANUFACTURING THE SAME

BACKGROUND OF THE INVENTION

1. Field of the Invention

The present invention relates to a light-emitting device using luminescence such as electroluminescence, and more particularly relates to a light-emitting device with a light-emitting element that is formed by interposing a light-emitting layer between a pair of electrodes.

2. Description of the Related Art

A display device including a light-emitting element (hereinafter, referred to as a light-emitting device) has advantages such as wide viewing angle, low power consumption, and rapid response speed as compared with a liquid crystal display device, and research and development thereof have been actively carried out.

The light-emitting element has a structure of a luminescent material provided between a pair of electrodes, and light from the luminescent material is extracted depending on the light-transmitting properties of the electrodes.

For example, in the case of desiring to extract light toward one direction, a light-transmitting material is used for one electrode provided in the direction where light is extracted whereas the other electrode is formed by using a material that has no light-transmitting property, that is, a reflective material. The light extraction efficiency can be enhanced by using reflection at the other electrode effectively.

At the same time, when this reflective material is used for the electrode, reflection of outside light becomes a problem. In order to prevent reflection of outside light, a structure provided with a polarization plate or a circular polarization plate should be considered. However, there is fear that light from the light-emitting element is lost when a polarization plate or the like is used.

As a method for preventing reflection of outside light, a display device is proposed, where the optical distance between a pair of electrodes is made to satisfy a given formula, a resonator structure is introduced, and the resonance wavelength coincides with the peak wavelength of a spectrum of light to be extracted (refer to Patent Document 1).

[Patent Document 1] Japanese Patent Application Laid-Open No. 2004-178930

SUMMARY OF THE INVENTION

Patent Document 1 describes a light-emitting element in which the optical distance between edges on a light-emitting element side of first and second electrodes satisfies an optical distance to improve the color purity by multiple interference. This optical distance is controlled by varying the film thickness of a light-emitting element for each of red, green, blue colors. When the film thicknesses of the light-emitting elements are varied as described above, the driving voltages of the respective light-emitting element are different from each other, and in particular, the driving voltage of the light-emitting element is increased as the film thickness is thicker.

In addition, it is described in Patent Document 1 that the first electrode is formed with the use of palladium (Pt), gold (Au), silver (Ag), chromium (Cr), or tungsten (W) as a material that has the highest possible reflectivity, and that a color filter absorbs outside light reflected at a wiring to improve the contrast.

However, it is believed that only insufficient antireflection effect against outside light can be obtained when a material that has a high reflectivity is used for the first electrode and a color filter is provided in order to absorb outside light reflected at the first electrode, which leads to decrease in contrast.

Consequently, it is an object of the present invention to provide a high-contrast light-emitting device. Specifically, it is an object of the present invention to provide a light-emitting device with contrast increased without using a polarization plate.

In view of the objects described above, the present invention has a feature of a structure for reducing reflection of a specific wavelength or specific waveband (hereinafter, referred to as a wavelength) of a luminescent color from a light-emitting element at an electrode where light from the light-emitting element is reflected. The structure is that the film thickness of an electroluminescent layer between the electrode and the opposed substrate is determined for reducing reflection of the wavelength of the luminescent color from the light-emitting element. In this case, the film thickness of the electroluminescent layer is determined so that reflection of the wavelength of the luminescent color from the light-emitting element is reduced at the electrode. In addition, in the case of performing full-color display in which a wavelength of light from a light-emitting element is different, it is a feature that a structure for reducing reflection of a wavelength of a luminescent color from each light-emitting element is provided.

A specific aspect of the present invention is a light-emitting device including a first electrode, a second electrode provided to be opposed to the first electrode, a light-emitting element comprising the first electrode and the second electrode, and a color filter through which light from the light-emitting element is transmitted, where refection of a wavelength of light (referred to as an emission wavelength) emitted from the light-emitting element at the first electrode is reduced. Further, the light-emitting device according to the present invention has a feature that the color filter includes a material that has a high transmittance with respect to the emission wavelength from the light-emitting element. Accordingly, visible light having at least peak wavelength passes through the color filter. In addition, the present invention has a feature of a method for manufacturing the light-emitting device.

Another aspect of the present invention is a light-emitting device including a first electrode, a second electrode provided to be opposed to the first electrode, a light-emitting element comprising the first electrode and the second electrode, and a color filter through which light from the light-emitting element is transmitted, where the light-emitting element emits monochromatic light, and refection of an emission wavelength from the monochromatic light-emitting element at the first electrode is reduced. Further, the light-emitting device according to the present invention has a feature that the color filter includes a material that has a high transmittance with respect to the emission wavelength from the monochromatic light-emitting element. In addition, the present invention has a feature of a method for manufacturing the light-emitting device.

Another aspect of the present invention is a light-emitting device including a first electrode, a second electrode provided to be opposed to the first electrode, an electroluminescent layer provided between the first electrode and the second electrode, a light-emitting element comprising the first electrode, the second electrode, and the electroluminescent layer, and a color filter through which light from the light-emitting element is transmitted, where any one layer of the electroluminescent layer has a thickness that reduces reflection of an emission wavelength from the light-emitting element at the first electrode. Further, the light-emitting device according to the present invention has a feature that the color filter includes a material that has a high transmittance with respect to the emission wavelength from the light-emitting element. In addition, the present invention has a feature of a method for manufacturing the light-emitting device.

Another aspect of the present invention is a light-emitting device including a first electrode, a second electrode provided to be opposed to the first electrode, an electroluminescent layer provided between the first electrode and the second electrode, a light-emitting element comprising the first electrode, the second electrode, and the electroluminescent layer, and a color filter through which light from the light-emitting element is transmitted, where the light-emitting element emits monochromatic light, any one layer of the electroluminescent layer has a thickness that reduces reflection of an emission wavelength from the monochromatic light-emitting element at the first electrode. Further, the light-emitting device according to the present invention has a feature that the color filter includes a material that has a high transmittance with respect to the emission wavelength from the monochromatic light-emitting element. In addition, the present invention has a feature of a method for manufacturing the light-emitting device.

Another aspect of the present invention is a light-emitting device comprising, a first electrode, a light emitting layer adjacent to the first electrode, a second electrode adjacent to the light emitting layer with the light emitting layer interposed between the first and second electrodes, a color filter adjacent to the second electrode with the second electrode interposed between the light emitting layer and the color filter, where a reflectance of light emitted from said light emitting layer at the first electrode is 10% or less.

Another aspect of the present invention is a light-emitting device comprising, a first electrode, a light emitting layer adjacent to the first electrode, a second electrode adjacent to the light emitting layer with the light emitting layer interposed between the first and second electrodes, a color filter adjacent to the second electrode with the second electrode interposed between the light emitting layer and the color filter, where a reflectance of light emitted from said light emitting layer at the first electrode is 10% or less, and where visible light having at least peak wavelength passes through the color filter.

Another aspect of the present invention is a light-emitting device comprising, a first electrode, a light emitting layer adjacent to the first electrode, a second electrode adjacent to the light emitting layer with the light emitting layer interposed between the first and second electrodes, a color filter adjacent to the second electrode with the second electrode interposed between the light emitting layer and the color filter, where a reflectance of light emitted from said light emitting layer at the first electrode is 10% or less, where visible light having at least peak wavelength passes through the color filter, and where the light emitting layer emits monochromatic light.

Another aspect of the present invention is a light-emitting device comprising, a first electrode, a electroluminescent layer adjacent to the first electrode, a second electrode adjacent to the light emitting layer with the light emitting layer interposed between the first and second electrodes, a color filter adjacent to the second electrode with the second electrode interposed between the light emitting layer and the color filter, where the electroluminescent layer having the layer including a metal oxide, where the layer including a metal oxide a thickness that 10% or less reflectance of an emission wavelength from the electroluminescent layer at the first electrode, where visible light having at least peak wavelength passes through the color filter, and where the light-emitting element emits monochromatic light.

In the light-emitting device according to the present invention, the layer of the electroluminescent layer, which has the thickness that reduces reflection of the emission wavelength from the light-emitting element, has a layer including a metal oxide selected from the group consisting of a vanadium oxide, a molybdenum oxide, a niobium oxide, a rhenium oxide, a tungsten oxide, a ruthenium oxide, a titanium oxide, a chromium oxide, a zirconium oxide, a hafnium oxide, and a tantalum oxide. In addition, the present invention has a feature of a method for manufacturing the light-emitting device.

In the present invention, the color filter may include a color conversion layer.

In particular, the present invention has a feature of a light-emitting device that emits a monochromatic luminescent color. As compared with a full-color light-emitting device, this monochromatic light-emitting device causes no color mixture or has no viewing angle dependence even when the distance between a TFT substrate over which a transistor is provided and an opposed substrate that is opposed to the TFT substrate is large. In addition, restriction of alignment can be alleviated when the TFT substrate is attached to the opposed substrate. Further, the manufacturing process is simple since it is not necessary to form color filters separately for each color. Moreover, the definition can be made higher in the same design rule as that of a full-color light-emitting device.

In addition, antireflection coating (AR coating: Anti-Reflection treatment coating) may be performed to one or both sides of the substrate to which light is emitted, the TFT substrate or the opposed substrate.

Moreover, the present invention is suitable for a top-emission light-emitting device that has an opposed substrate to which luminescence is emitted. Reflection of outside light can be effectively prevented by using a light-emitting element that has an electrode structure according to the present invention and additionally using a color filter for a top-emission light-emitting device. In addition, a light-emitting element that has an electrode structure according to the present invention can be applied also to a bottom-emission light-emitting device that has a TFT substrate to which luminescence is emitted. However, it is necessary to consider a protective film a gate insulating film, and a wiring layer that are provided between the electrode and the substrate.

According to the present invention, a light-emitting element in which unnecessary reflection at an electrode is reduced and a light-emitting device that has the light-emitting element can be provided, and only luminescence from the light-emitting element is transmitted through a color filter or the like included in the light-emitting device to enable control of the contrast and the like.

According to the present invention described above, a light-emitting device that requires no polarization plate or the like can be provided. Accordingly, luminescence from a light-emitting element is not attenuated. Further, it is possible to reduce costs since the present invention requires no polarization plate or the like although the polarization plate or the like is expensive. Moreover, although there is a problem that the polarization plate or the like is fragile, this problem is not caused either.

Further, the present invention can be applied to a monochromatic light-emitting device, and low cost can be thus achieved as compared with a full-color light-emitting device.

DETAILED DESCRIPTION OF THE INVENTION

Figure 1:
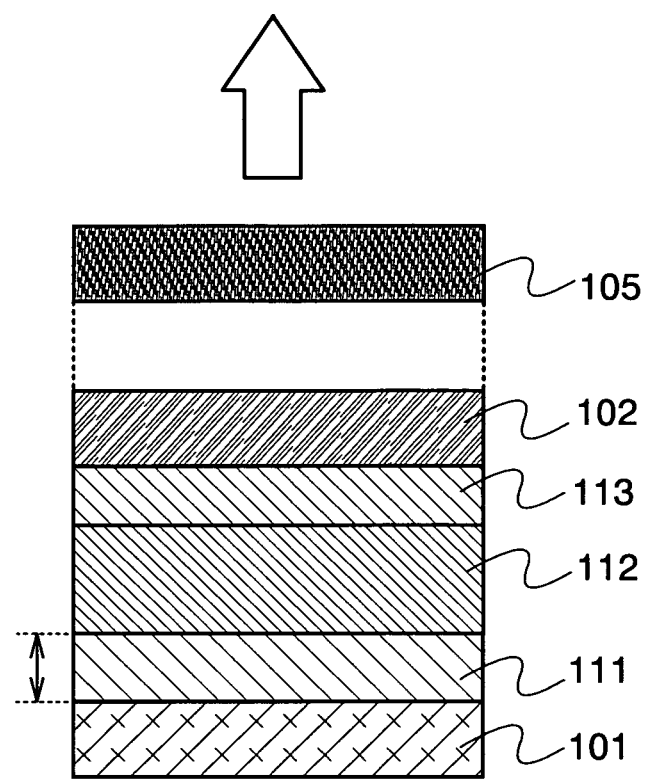
FIG. 1 is an enlarged view of a light-emitting element of a light-emitting device according to the present invention.

Embodiment modes of the present invention will be described below with reference to the accompanying drawings. However, the present invention may be embodied in a lot of different forms, and it is to be easily understood that various changes and modifications will be apparent to those skilled in the art unless such changes and modifications depart from the scope of the present invention. Therefore, the present invention is not to be construed with limitation to what is described in the embodiment modes. It is to be noted that the same reference numeral denotes the same portion or a portion that has the same function in the all drawings for describing the embodiments, and repeated description of the portion will be omitted.

Embodiment Mode 1

In the present embodiment, a light-emitting element that has a structure for lowering the reflectivity of a reflective electrode and a light-emitting device that has a color filter will be described. In the present embodiment mode, the light-emitting device is described as a monochromatic light-emitting device. FIG. 1 shows a light-emitting element that has a first electrode 101, a second electrode 102 that is opposed to the first electrode 101, and between these electrodes, first to third layers 111 to 113 provided in this order from the first electrode 101 side. The first electrode 101 has a light-reflecting property, and the second electrode 102 has a light-transmitting property. It is to be noted that a light-transmitting property can be obtained by forming the second electrode 102 with the use of a light-transmitting material. However, even when a material that has no light-transmitting property is used, a light-transmitting property can be obtained by making the second electrode 102 thinner to such a degree that the light-transmitting property is provided. Further, a color filter 105 is provided in a direction of light emission, that is, on the second electrode 102 side. The color filter 105 can be formed by screen printing, droplet discharge, or the like with the use of a known material. It is to be noted that the first electrode 101, the second electrode 102, the first to third layers 111 to 113 can be formed by evaporation and can be formed continuously without exposing the air.

Further, it is a feature that the reflectivity of the first electrode 101 with respect to an emission wavelength emitted from any one of the first to third layers 111 to 113 is reduced. Specifically, the film thickness of at least one of the first to third layers 111 to 113 is determined so as to reduce the reflectivity at the first electrode 101. Visible light having at least emission wavelength passes through the color filter. In particular, it is preferable to determine the film thickness of the first layer 111. The film thickness of the first layer 111 is determined so that a layer corresponding to a light-emitting layer in which an electron and a hole are recombined among the first to third layers 111 to 113. The result is that the reflectivity of the first electrode 101 with respect to an emission wavelength of light emitted from any one of the first to third layers 111 to 113 can be reduced. Further, only luminescence emitted from any one of the first to third layer 111 to 113 can be obtained without considering reflected light. Accordingly, the contrast and the like can be controlled in consideration of only the luminescence, namely, control of the control and the like can be made simpler since light of a component reflected at the first electrode 101 is not considered.

On the other hand, Patent Document 1 discloses a technical idea that a first electrode has a higher reflectivity as much as possible, which is different from the technical idea of the present invention.

Further, the color filter 105 is provided so as to increase the transmittance of an emission wavelength from the light-emitting element described above. Accordingly, visible light having at least peak wavelength passes through the color filter. The result is that the color filter 105 is able to absorb light other then the luminescent color and no component of outside light enters the first electrode 101. Accordingly, the contrast can be enhanced.

Briefly, according to the present invention, the light-emitting element that provides specific light can act like a polarization plate by reducing reflection of the light at the first electrode 101 and suppressing wavelengths other than the wavelength of the light with the use of the color filter 105. In this case, light is emitted from the second electrode 102 opposed to the first electrode 101 (a top-emission light-emitting device).

In addition, in the present invention, since the film thickness any one of the first to third layers 111 to 113 is varied, it is necessary to make a specific layer thicker. Consequently, it is a feature that a mixed layer including an organic compound and a metal oxide that is an inorganic compound (referred to as a layer including a metal oxide) is used for the layer that is made thicker. It is to be noted that the mixed layer includes a layer in which the organic compound and the inorganic compound are mixed and a layer in which the organic compound and the inorganic compound are laminated.

In general, it is not preferable to make a layer of a light-emitting layer thicker since the driving voltage is increased. However, when the mixed layer including the organic compound and the metal oxide is used, the driving voltage itself can be made lower, and further, the driving voltage is not increased even when the mixed layer is made thicker. The use of this mixed layer including the organic compound and the inorganic compound makes it possible to suppress crystallization of the organic compound and make the mixed layer thicker without increase in resistance. Therefore, even when there is irregularity due to dust, contamination, and the like on a substrate, the irregularity has almost no influence. Accordingly, defects such as a short circuit between the first electrode 101 and the second electrode 102 due to irregularity can be prevented, with the result that the mass productivity can be enhanced.

Figure 12:
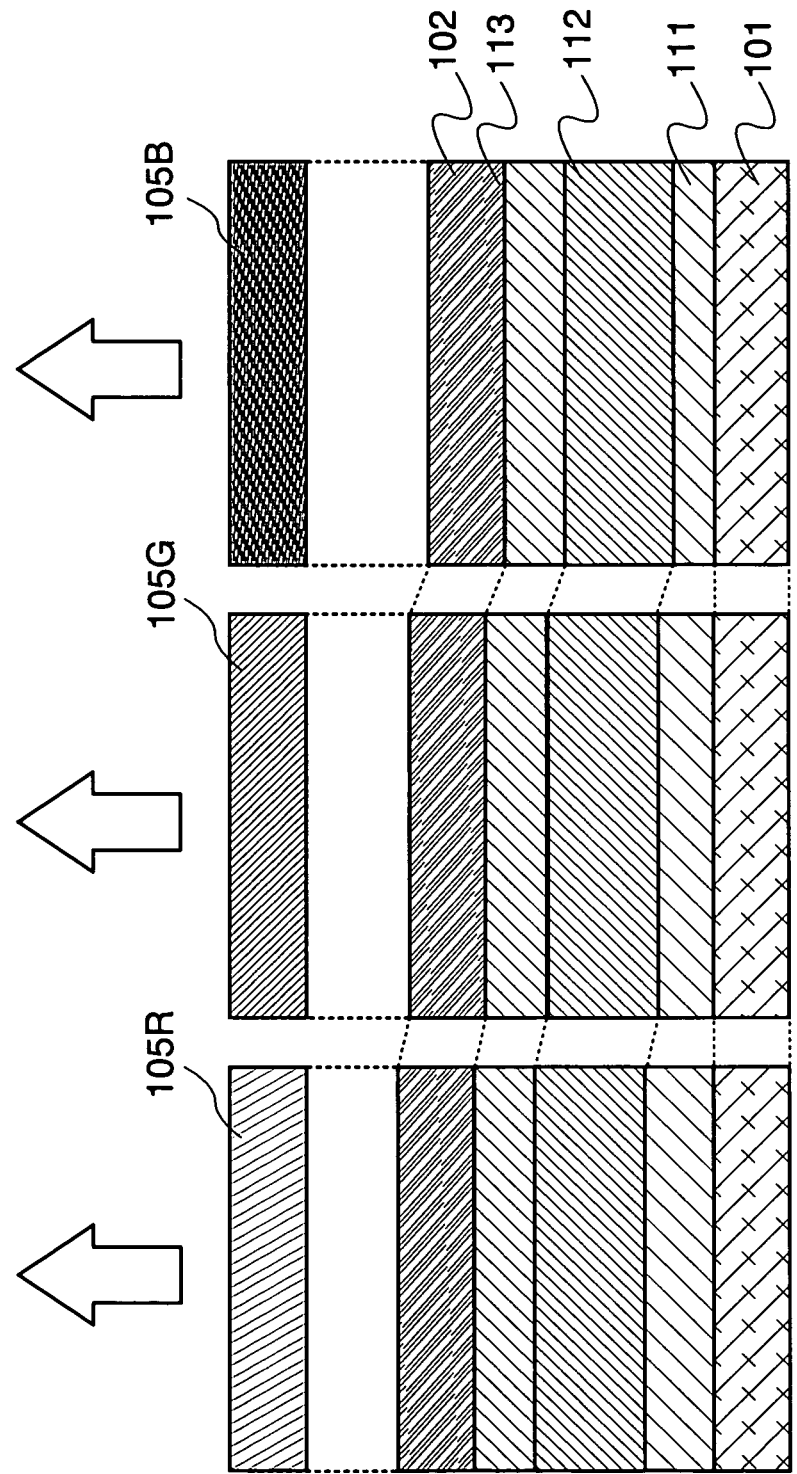
FIG. 12 is a cross-sectional view illustrating a light-emitting device according to the present invention.

In addition, a full-color light-emitting device may be formed although a monochromatic light-emitting device is described in the present embodiment mode. In the case of a full-color light-emitting device, for example, as shown in FIG. 12, color filters 105R, 105G, and 105B may be provided for regions from which a red (R), a green (G), and a blue (B) are produced, respectively. Further, the film thickness of any one of first to third layers 111 to 113, preferably the film thickness of the first layer 111, is determined so that a first electrode 101 reflects light of each color of RGB at a lower reflectivity.

As described above, reflection of light from the light-emitting element at the first electrode 101 can be reduced, and the color filter 105 makes it possible to prevent wavelengths other than a luminescent color from the light-emitting element from being transmitted. Accordingly, the contrast can be enhanced by adjusting only light from the light-emitting element, and a light-emitting device that requires no polarization plate or the like can be provided.

Embodiment Mode 2

Figure 2:
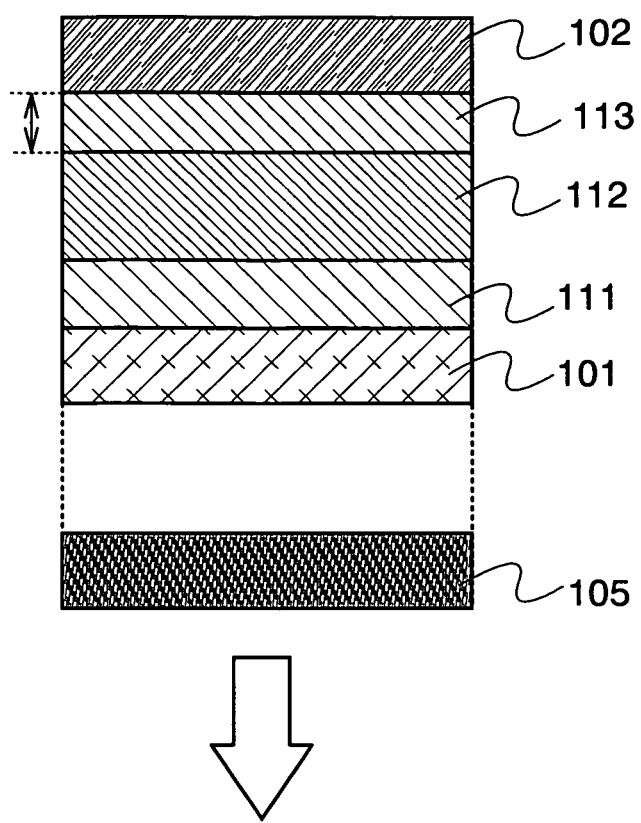
FIG. 2 is an enlarged view of a light-emitting element of a light-emitting device according to the present invention.

In the present embodiment mode, FIG. 2 shows a case where a color filter 105 is provided is provided on the first electrode 101 side unlike FIG. 1, and light is emitted from the first electrode 101 (a bottom-emission light-emitting device).

In the case of providing the color filter 105 on the first electrode 101 side in this way, a plurality of insulating films constituting a thin film transistor and the like, which are stacked, are provided below the first electrode 101 (corresponding to between the first electrode 101 and a substrate). Therefore, it is preferable to determine the film thicknesses of the first to third layers 111 to 113 also in consideration of light that is reflected between these insulating films and the like. In addition, in a region through which light is transmitted, the insulating films and the like may be removed As described above, the present invention has a feature that the film thickness of the any one of the first to third layers 111 to 113 is determined so that the reflectivity of the second electrode 102 with respect to an emission wavelength of emitted light is reduced. In this case, it is preferable to determine the film thickness of the third layer 113 between a light-emitting layer in which an electron and a hole are recombined and the second electrode 102 among the first to third layers 111 to 113. Further, it is preferable to use a mixed layer including an organic compound and an inorganic compound for a layer that is required to be made thicker since the driving voltage is not increased.

Figure 13:
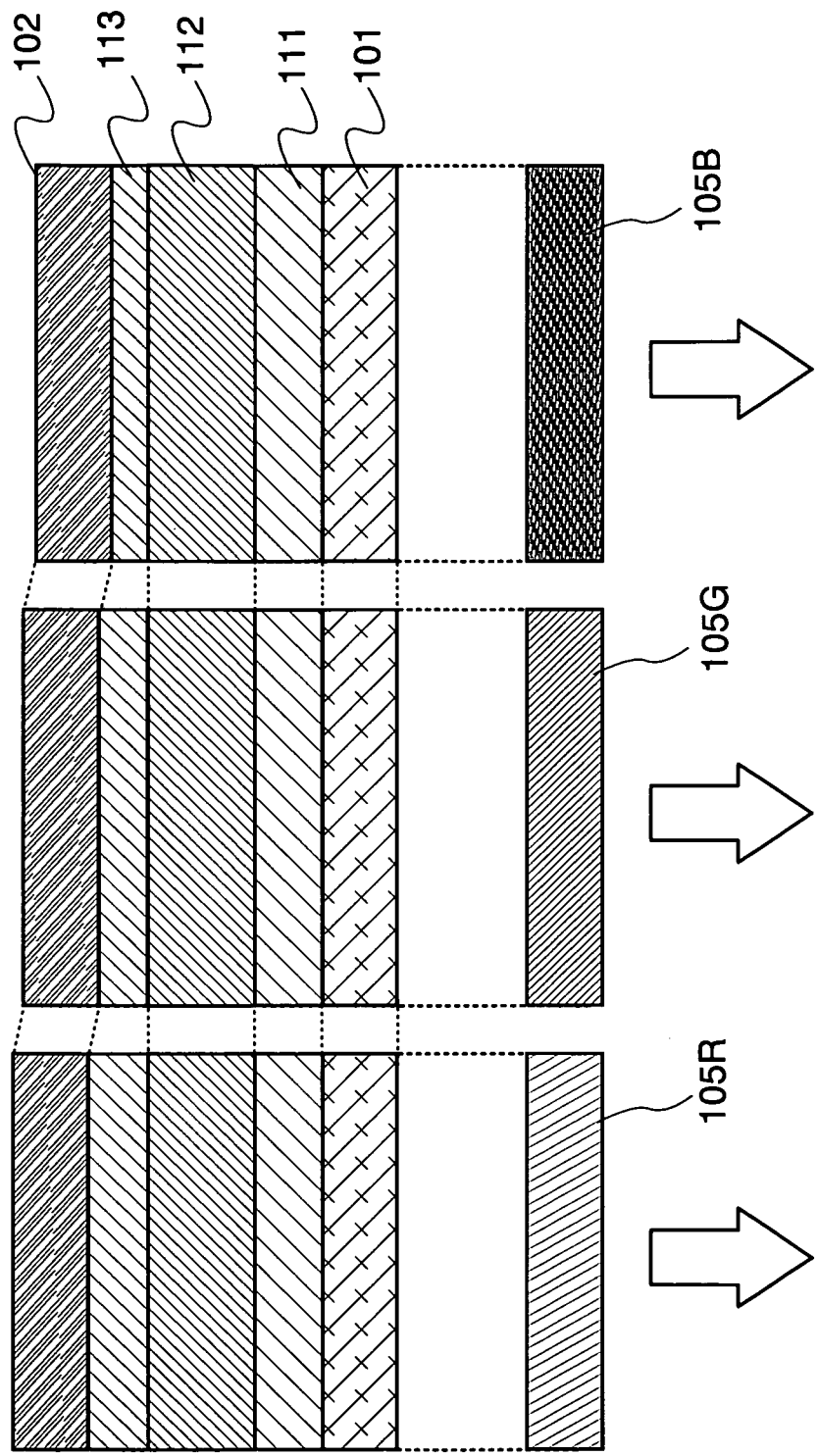
FIG. 13 is a cross-sectional view illustrating a light-emitting device according to the present invention.

In addition, a full-color light-emitting device may be formed although a monochromatic light-emitting device is described in the present embodiment mode. In the case of a full-color light-emitting device, for example, as shown in FIG. 13, color filters 105R, 105G, and 105B may be provided for regions from which a red (R), a green (G), and a blue (B) are produced, respectively. Further, the film thickness of any one of first to third layers 111 to 113, preferably the film thickness of the third layer 113, is determined so that a second electrode 102 reflects light of each color of RGB at a lower reflectivity.

As described above, reflection of light from the light-emitting element at the second electrode 102 can be reduced, and the color filter 105 makes it possible to prevent wavelengths other than a luminescent color from the light-emitting element from being transmitted. Accordingly, the contrast can be enhanced by adjusting only light from the light-emitting element, and a light-emitting device that requires no polarization plate or the like can be provided.

Embodiment Mode 3

In the present embodiment mode, the structure of a light-emitting element will be described.

Figure 3:
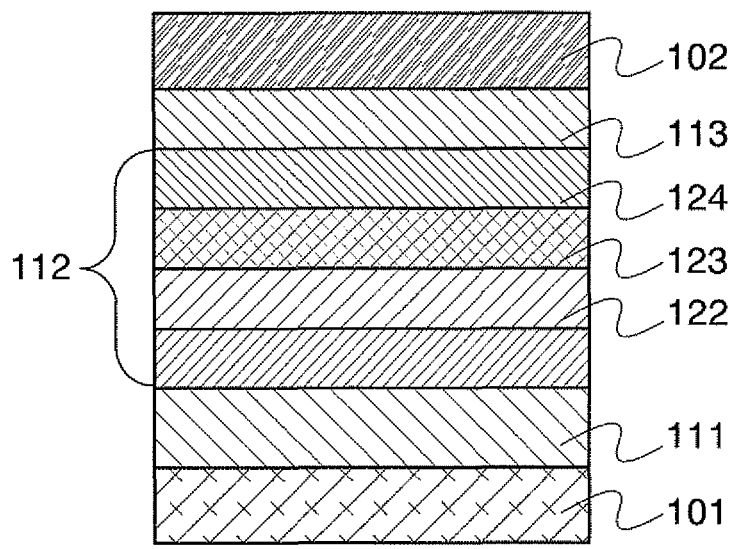
FIG. 3 is a cross-sectional view illustrating a light-emitting element according to the present invention.

As shown in FIG. 3, the light-emitting element according to the present invention has a first electrode 101 and a second electrode 102 that are opposed to each other, and has a first layer 111, a second layer 112, and a third layer 113 that are stacked in this order from the first electrode 101 side. When a voltage is applied to this light-emitting element, for example, so that the potential of the first electrode 101 is higher than the potential of the second electrode 102, a hole is injected from the first layer 111 into the second layer 112, and an electron is injected from the third layer 113 into the second layer 112. Then, the hole and the electron are recombined to excite a luminescent material, and luminescence is produced when the excited luminescent material returns to the ground state.

Next, the first to third layers 111 to 113, the first electrode 101, and the second electrode 102 will be described.

The first layer 111 is a layer that generates holes. This function can be achieved by using, for example, a layer including a hole transporting material and a material that exhibits an electron accepting property to the hole transporting material. In addition, it is preferable that the material that exhibits an electron accepting property to the hole transporting material be included so that the molar ratio of the material to the hole transporting material is 0.5 to 2 (=the material that exhibits an electron accepting property to the hole transporting material/the hole transporting material).

The hole transporting material is a material in which electrons are transported more then electrodes, and for example, organic compounds, aromatic amine compounds such as 4,4'-bis[N-(1-naphthyl)-N-phenylamino]biphenyl (abbreviation: α-NPD), 4,4'-bis[N-(3-methylphenyl)-N-phenylamino]biphenyl (abbreviation: TPD), 4,4',4"-tris(N,N-diphenylamino)triphenylamine (abbreviation: TDATA), 4,4',4"-tris[N-(3-methylphenyl)-N-phenylamino]-triphenylamine (abbreviation: MTDATA), 4,4'-bis[N-{4-(N,N-di-m-tolylamino)phenyl}-N-phenylamino]biphenyl (abbreviation: DNTPD), and phthalocyanine compounds such as phthalocyanine (abbreviation: $H_2Pc$) and copper phthalocyanine (abbreviation: CuPc), can be used as the hole transporting material. It is to be noted that the hole transporting material is not to be considered limited to these.

In addition, an oxide of a transition metal belonging to any one of Group 4 to 12 of the periodic table (a metal oxide) can be used as the material that exhibits an electron accepting property to the hole transporting material. Among others, an oxide of a transition metal belonging to any one of Groups 4 to 8 of the periodic table often has a higher electron accepting property, and a vanadium oxide, a molybdenum oxide, a niobium oxide, a rhenium oxide, a tungsten oxide, a ruthenium oxide, a titanium oxide, a chromium oxide, a zirconium oxide, a hafnium oxide, and a tantalum oxide are particularly preferable. Besides the oxides, nitrides and oxynitrides of the metals mentioned above may be used. It is to be noted that the material that exhibits am electron accepting property to the hole transporting material is not to be considered limited to these.

Further, it is preferable to form the first layer 111 by using a layer in which the hole transporting material, which is composed of an organic material, and the material that exhibits an electron accepting property to the hole transporting material, which is composed of the metal oxide mentioned above, are mixed. Crystallization of the organic compound that is used for the first layer 111 can be suppressed by using this layer in which the organic material and the inorganic material are mixed, and the first layer 111 can be thus formed to be thicker without increase in resistance. Therefore, even when there is irregularity due to dust, contamination, and the like on a substrate, the irregularity has almost no influence since the first layer 111 is made thicker. Accordingly, defects such as a short circuit between the first electrode 101 and the second electrode 102 due to irregularity can be prevented. Further, the layer in which the material that exhibits an electron accepting property to the hole transporting material, which is composed of the metal oxide mentioned above, is mixed has a higher conductivity, and thus, can be made thicker. Since the first electrode 101 and the second layer 112 can be kept further away from each other by making the first layer 111 thicker in this way, quenching of luminescence due to a metal can be prevented.

Further, the first layer 111 may include another organic compound. As the organic compound, rubrene and the like can be cited. The reliability can be improved by the addition of rubrene.

In addition to this, the first layer 111 may be a layer composed of a metal oxide such as a molybdenum oxide, a vanadium oxide, a ruthenium oxide, a cobalt oxide, and a copper oxide. Alternatively, other than the metal oxide, the first layer 111 may be a layer composed of a metal nitride including this metal element.

This first layer 111 can be formed by evaporation. When a layer including a plurality of mixed compounds is used as the first layer 111, co-evaporation can be used. The co-evaporation includes co-evaporation by resistance-heating evaporation, co-evaporation by electron-beam evaporation, and co-evaporation by resistance-heating evaporation and electron-beam evaporation, and in addition, there are methods such as deposition by resistance-heating evaporation and sputtering and deposition by electron-beam evaporation and sputtering. The first layer 111 can be formed by combining the same type of methods or different types of methods. In addition, the example described above shows a layer including two kinds of materials. However, when three or more kinds of materials are included, the first layer 111 can be formed also in the same way by combining the same type of methods or different types of methods.

Next, the second layer 112 that is a layer including a light-emitting layer will be described. The layer including the light-emitting layer may be a single layer composed of only the light-emitting layer or a multilayer. To cite a case, a specific multilayer includes a light-emitting layer and additionally a plurality of layers selected from electron transporting layers and hole transporting layers. In FIG. 3, a multilayer case in which the second layer 112 includes a hole transporting layer 122, a light-emitting layer 123, and an electron transporting layer 124 is shown.

The hole transporting layer 122 can be formed with the use of a known material. Typical examples include aromatic amine compounds, for example, aromatic amine compounds such as 4,4'-bis[N-(1-naphthyl)-N-phenyl-amino]biphenyl (hereinafter, referred to as α-NPD), 4,4',4"-tris(N,N diphenyl-amino)triphenylamine (hereinafter, referred to as TDATA), 4,4',4"-tris[N-(3 methylphenyl)-N-phenyl-amino]triphenylamine (hereinafter, referred to as MTDATA).

It is preferable that the light-emitting layer 123 be a layer including a luminescent material dispersed in a material that has a larger energy gap than the luminescent material. It is to be noted that the energy gap indicates the energy gap between the LUMO level and the HOMO level. In addition, a material that provides a favorable luminous efficiency and is capable of producing luminescence of a desired emission wavelength may be used for the luminescent material.

For the material that is used for dispersing the luminescent material, for example, anthracene derivatives such as anthracene derivatives such as 9,10-di(2-naphthyl)-2-tert-butylanthracene (abbreviation: t-BuDNA), carbazole derivatives such as 4,4'-bis(N-carbazolyl)-biphenyl (abbreviation: CBP), and metal complexes such as bis[2-(2-hydroxyphenyl)-pyridinato]zinc (abbreviation: $Znpp_2$) and bis[2-(2-hydroxyphenyl)-benzoxazolato]zinc (abbreviation: ZnBOX) can be used. However, the material that is used for dispersing the luminescent material is not limited to these materials. When the luminescent material is dispersed, concentration quenching of luminescence from the luminescent material can be prevented.

Next, luminescent materials for the light-emitting layer 123 will be mentioned. When red luminescence is desired to be obtained, 4-dicyanomethylene-2-isopropyl-6-[2-(1,1,7,7-tetramethyljulolidine-9-yl)ethenyl]-4H-pyran (abbreviation: DCJTI), 4-dicyanomethylene-2-methyl-6-[2-(1,1,7,7-tetramethyljulolidine-9-yl)ethenyl]-4H-pyran (abbreviation: DCJT), 4-dicyanomethylene-2-tert-butyl-6-[2-(1,1,7,7-tetramethyljulolidine-9-yl)ethenyl]-4H-pyran (abbreviation: DCJTB), periflanthene, and 2,5-dicyano-1,4-bis-[2-(10-methoxy-1,1,7,7-tetramethyljulolidine-9-yl)ethenyl]-benzene, bis[2,3-bis(4-fluorophenyl)quinoxalinato]iridium (acetylacetonato) (abbreviation: $Ir(Fdpq)_2(acac)$), and the like can be used. However, the material for obtaining red or reddish luminescence is not limited to these materials, and a material that produces luminescence with a peak wavelength from 600 nm to 680 nm in an emission spectrum can be used.

When green luminescence is desired to be obtained, N,N'-dimethylquinacridone (abbreviation: DMQd), coumarin 6, coumarin 545T, tris(8-quinolinolato)aluminum (abbreviation: $Alq_3$), and the like can be used. However, the material for obtaining green or greenish luminescence is not limited to these materials, and a material that produces luminescence with a peak wavelength from 500 nm to 550 nm in an emission spectrum can be used.

In addition, when blue luminescence is desired to be obtained, 9,10-di(2-naphthyl)-tert-butylanthracene (abbreviation: t-BuDNA), 9,9'-bianthryl, 9,10-diphenylanthracene (abbreviation: DPA), 9,10-bis(2-naphthyl)anthracene (abbreviation: DNA), bis(2-methyl-8-quinolinolato)-4-phenylphenolato-gallium (abbreviation: BGaq), bis(2-methyl-8-quinolinolato)-4-phenylphenolato-aluminum (abbreviation: BAlq), and the like can be used for the light-emitting layer 123. However, the material for obtaining blue or bluish luminescence is not limited to these materials, and a material that produces luminescence with a peak wavelength from 420 nm to 500 nm in an emission spectrum can be used.

In the case of forming monochromatic light-emitting device, the selection is possible from the luminescent materials for the three colors, and further, a color filter makes it possible to produce desired light emission.

A layer in which a metal oxide is mixed in this organic compound that serves as the light-emitting layer may be used.

Next, the electron transporting layer 124 will be described. The electron transporting layer 124 is a layer that has a function of transporting electrons injected from the second electrode 102 to the light-emitting layer 123. By providing the electron transporting layer 124 in this way to keep the second electrode 102 and the light-emitting layer 123 further away from each other, quenching of luminescence due to a metal can be prevented.

It is preferable that the electron transporting layer 124 be formed with the use of a material in which the hole mobility is higher than the electron mobility. Further, it is more preferable that the electron transporting layer 124 be formed with the use of a material that has an electron mobility of $10^{-6}$ cm$^2$/Vs or more. In addition, the electron transporting layer 124 may be a layer that has a multilayer structure formed by combining two or more layers each including the material described above. As a specific material for the electron transporting layer 124, a metal complex having a quinoxaline skeleton or a benzoquinoline skeleton, such as tris(8-quinolinolato)aluminum (abbreviation: Alq$_3$), tris(4-methyl-8-quinolinolato)aluminum (abbreviation: Almq$_3$), bis(10-hydroxybenzo[h]-quinolinato)beryllium (abbreviation: BeBq$_2$), and BAlq mentioned above, is preferred. In addition, a metal complex having an oxazole-based or thiazole-based ligand, such as bis[2-(2-hydroxyphenyl)-benzoxazolato]zinc (abbreviation: Zn(BOX)$_2$) and bis[2-(2-hydroxyphenyl)-benzothiazolato]zinc (abbreviation: Zn(BTZ)$_2$), can be used. Moreover, besides metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazole-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproin (abbreviation: BCP), and the like can be also used.

This second layer 112 can be manufactured by evaporation. When a mixed layer is formed for the second layer 112, co-evaporation can be used. The co-evaporation includes co-evaporation by resistance-heating evaporation, co-evaporation by electron-beam evaporation, and co-evaporation by resistance-heating evaporation and electron-beam evaporation, and in addition, there are methods such as deposition by resistance-heating evaporation and sputtering and deposition by electron-beam evaporation and sputtering. The first layer 111 can be formed by combining the same type of methods or different types of methods. In addition, the example described above shows a layer including two kinds of materials. However, when three or more kinds of materials are included, the first layer 111 can be formed also in the same way by combining the same type of methods or different types of methods as described above.

Next, the third layer 113 that is layer that generates electrons will be described. As this third layer 113, for example, a layer including an electron transporting material and a material that exhibits an electron donating property to the electron transporting material can be cited.

It is to be noted that the electron transporting material is a material in which more electrons are transported than holes, and for example, metal complexes such as tris(8-quinolinolato)aluminum (abbreviation: Alq$_3$), tris(4-methyl-8-quinolinolato)aluminum (abbreviation: Almq$_3$), bis(10-hydroxybenzo[h]-quinolinato)beryllium (abbreviation: BeBq$_2$), bis(2-methyl-8-quinolinolato)-4-phenylphenolato-aluminum (abbreviation: BAlq), bis[2-(2-hydroxyphenyl)-benzoxazolato]zinc (abbreviation: Zn(BOX)$_2$), and bis[2-(2-hydroxyphenyl)-benzothiazolato]zinc (abbreviation: Zn(BTZ)$_2$), and further, 2-(4-biphenylyl)-5-(4-tert-butylphenyl)-1,3,4-oxadiazole (abbreviation: PBD), 1,3-bis[5-(p-tert-butylphenyl)-1,3,4-oxadiazole-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproin (abbreviation: BCP), and 4,4-bis(5-methylbenzoxazol-2-yl)stilbene (abbreviation: BzOs) can be used for the electron transporting material. In addition, the third layer 113 can be formed with the use of an n-type semiconductor. However, the electron transporting material is not limited to these.

In addition, for the material that exhibits an electron donating property to the electron transporting material, a substance selected from alkali metals and alkali-earth metals, specifically such as lithium (Li), calcium (Ca), sodium (Na), potassium (K), and magnesium (Mg), can be used. Further, specific materials include oxides of the alkali metals, oxides of the alkali-earth metals, nitrides of the alkali metals, and nitrides of the alkali-earth metals, specifically, a lithium oxide (Li$_2$O), a calcium oxide (CaO), a sodium oxide (Na$_2$O), a potassium oxide (K$_2$O), and a magnesium oxide (MgO), lithium fluoride (LiF), cesium fluoride (CsF), and calcium fluoride (CaF$_2$). However, the material that exhibits an electron donating property to the electron transporting material is not limited to these. It is to be noted that it is preferable that the material that exhibits an electron donating property to the electron transporting material be included so that the molar ratio of material that exhibits an electron donating property to the electron transporting material to the electron transporting material is 0.5 to 2 (=the material that exhibits an electron donating property to the electron transporting material/the electron transporting material).

Alternatively, the third layer 113 may be a layer composed of a material such as zinc oxide, zinc sulfide, zinc selenide, tin oxide, or titanium oxide.

Further, it is preferable to form the third layer 113 by using a layer in which the electron transporting material, which is composed of an organic material, and the material that exhibits an electron donating property to the electron transporting material, which is composed of the metal oxide mentioned above, are mixed. Crystallization of the organic compound that is used for the third layer 113 can be suppressed by using this layer in which the organic material and the inorganic material are mixed, and the third layer 113 can be thus formed to be thicker without increase in resistance. Therefore, even when there is irregularity due to dust, contamination, and the like on a substrate, the irregularity has almost no influence since the third layer 113 is made thicker. Accordingly, defects such as a short circuit between the first electrode 101 and the second electrode 102 due to irregularity can be prevented. Further, the layer in which the material that exhibits an electron donating property to the hole electron transporting material, which is composed of the metal oxide mentioned above, is mixed has a higher conductivity, and thus, can be made thicker. Since the first electrode 101 and the second layer 112 can be kept further away from each other by making the third layer 113 thicker in this way, quenching of luminescence due to a metal can be prevented.

This third layer 113 can be manufactured by evaporation. When a mixed layer is formed for the third layer 113, co-evaporation can be used. The co-evaporation includes co-evaporation by resistance-heating evaporation, co-evaporation by electron-beam evaporation, and co-evaporation by resistance-heating evaporation and electron-beam evaporation, and in addition, there are methods such as deposition by resistance-heating evaporation and sputtering and deposition by electron-beam evaporation and sputtering. The first layer 111 can be formed by combining the same type of methods or different types of methods. In addition, the example described above shows a layer including two kinds of materials. However, when three or more kinds of materials are included, the first layer 111 can be formed also in the same way by combining the same type of methods or different types of methods as described above.

In the light-emitting element described above, the difference between the electron affinity of the electron transporting material included in the third layer 113 and the electron affinity of the material included in the layer in contact with the third layer 113 among the layers included in the second layer 112 is preferably 2 eV or less, more preferably 1.5 eV or less. Alternatively, when the third layer 113 is composed of an n-type semiconductor, the difference between the work function of the n-type semiconductor and the electron affinity of the material included in the layer in contact with the third layer 113 among the layers included in the second layer 112 is preferably 2 eV or less, more preferably 1.5 eV or less. By joining the second layer 112 and the third layer 113 as described above, electrons can be injected more easily from the third layer 113 to the second layer 112.

It is to be noted that the present invention has a feature that the film thicknesses of the first to third layers 111 to 113 are determined so as to reduce the reflectivity of the first electrode 101 with respect to an emission wavelength of emitted light, and is not to be considered limited to the structure of the light-emitting element shown in FIG. 3. For example, there may be a case where the electron transporting layer 124 is not provided although the structure provided with the electron transporting layer 124 formed in contact with the third layer 113 is shown. Accordingly, the light-emitting layer 123 in contact with the third layer 113 is provided. In this case, a material for dispersing a luminescent material is preferably used for the light-emitting layer 123. Also, it may well be that the electron transporting layer 124 is not provided.

In addition, a material that is capable of producing luminescence without being dispersed, such as Alq$_3$, can be used for the light-emitting layer 123. Since the material such as Alq$_3$ is a luminescent material that has a favorable carrier transporting property, a layer composed of only Alq$_3$ can function as a light-emitting layer without dispersing Alq$_3$. In this case, the light-emitting layer 123 corresponds to a luminescent material itself.

These first to third layers 111 to 113 can be formed by the same method, and can be therefore formed continuously without being exposed to the air. Impurity mixing into an interface and the like can be reduced by forming the first to third layers 111 to 113 continuously without being exposed to the air in this way.

Next, the electrodes will be described. Each of the first electrode 101 and the second electrode 102 are formed by using a conductive material. Further, the second electrode 102 provided on the side from which light from the light-emitting layer is extracted outside needs to have a light-transmitting property in addition to conductivity. The light-transmitting property can be obtained also by forming a quite thin film composed of a material that has no light-transmitting property.

As a material for the first electrode 101, a metal material that has a high reflectivity (reflective material), such as titanium (Ti), aluminum (Al), gold (Au), platinum (Pt), nickel (Ni), tungsten (W), chromium (Cr), molybdenum (Mo), iron (Fe), cobalt (Co), copper (Cu), or palladium (Pd), can be used. Further, the first electrode 101 can be formed, for example, by sputtering or evaporation. However, the material for the first electrode 101 is not limited to these. Even when the first electrode 101 is formed with the use of a metal material that has a high reflectivity in this way, the present invention has a feature of reducing the reflectivity with respect to an emission wavelength of emitted light.

In addition, a single layer of the metal material mentioned above or a lamination layer can be used for the first electrode 101.

Further, as a material for the second electrode 102, highly light-transmitting materials such as indium tin oxide (ITO), indium tin oxide containing silicon oxide (ITSO), and indium oxide containing 2 to 20% zinc oxide can be used. In addition, it is possible to use a thin film that is formed with the use of a metal material such as gold (Au), platinum (Pt), nickel (Ni), tungsten (W), chromium (Cr), molybdenum (Mo), iron (Fe), cobalt (Co), copper (Cu), or palladium (Pd) so as to have a light-transmitting property. However, the material for the first electrode 101 is not limited to these.

In addition, a single layer of the metal material mentioned above or a lamination layer can be used for the second electrode 102. When a lamination layer is used for the second electrode 102, it is also possible to use a structure of forming a thin film of the material mentioned above and laminating a light-transmitting material thereon. Of course, the second electrode 102 may be formed with the use of the thin material as a single layer. In order to prevent the resistance from increasing by forming the second electrode 102 to be thin, an auxiliary wiring can also be provided. Further, the use of a lamination layer can prevent the resistance from increasing.

It is to be noted that the first electrode 101 or the second electrode 103 can be an anode or a cathode depending on a voltage that is applied to the light-emitting element. In the case of an anode, a material that has a larger work function (a work function of 4.0 eV or more) is used. Alternatively, in the case of a cathode, a material that has a smaller work function (a work function of 3.8 eV or less) is used.

The first electrode 101 or the second electrode 102 can be formed by sputtering, evaporation, or the like. In the case of using evaporation, the first electrode 101, the first to third layers 111 to 113, and the second electrode 102 can be formed continuously without being exposed to the air. Impurity mixing into an interface and the like can be reduced by forming the light-emitting element continuously without being exposed to the air in this way.

In addition, according to the present invention, when a layer in which an organic compound and a metal oxide are mixed for a layer that is made thicker, a light-emitting device achieving lower power consumption can be provided. Further, quenching of luminescence can be prevented since the light-emitting layer can be kept further away from the first electrode or the second electrode by making the layer thicker. Furthermore, since the light-emitting element can be formed to be thicker, a short circuit between the electrodes can be prevented, and the mass productivity can be enhanced.

According to the present invention, which provides the thus described structure of the light-emitting element, reflection of light from the light-emitting element at the first electrode 101 or the second electrode 102 can be reduced, and a color filter 105 makes it possible to prevent wavelengths other than a luminescent color from the light-emitting element from being transmitted. Accordingly, the contrast can be enhanced by adjusting only light from the light-emitting element, and a light-emitting device that requires no polarization plate or the like can be provided.

Embodiment Mode 4

In the present embodiment mode, the structure of a light-emitting element that is different from the embodiment modes described above will be described.

Figure 4:
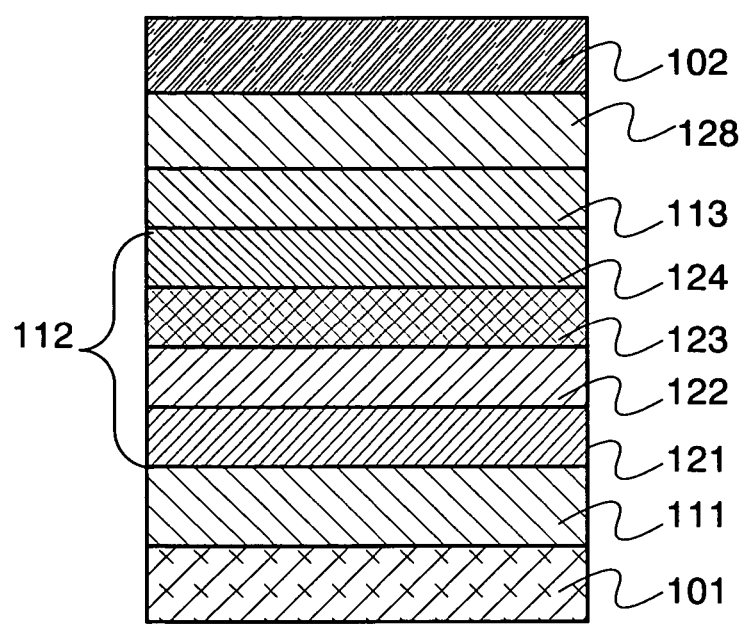
FIG. 4 is a cross-sectional view illustrating a light-emitting element according to the present invention.

As shown in FIG. 4, the light-emitting element shown in the present embodiment mode has a first electrode 101 and a second electrode 102 that are opposed to each other, and has a first layer 111, a second layer 112, a third layer 113, and a fourth layer 128 that are stacked in this order from the first electrode 101 side, where it is a feature that the fourth layer 128 is provided. The fourth layer 128 can be formed by using the same material as the first layer 111, and the other structure is the same as the embodiment described above. Therefore, description of the structure other than the fourth layer 128 is omitted.

When the fourth layer 128 is provided in this way, damage to the respective layers during forming the second electrode 102 can be reduced.

Further, the film thickness of any one of the first layer 111 to the fourth layer 128 is varied depending on each luminescent color. Accordingly, the reflectivity of the emission wavelength at the first electrode 101 can be reduced. In addition, in the case of varying the film thickness, a layer in which an organic compound and an inorganic compound are mixed is preferably used also for the fourth layer 128. Specifically, a vanadium oxide, a molybdenum oxide, a niobium oxide, a rhenium oxide, any one of a tungsten oxide, a ruthenium oxide, a titanium oxide, a chromium oxide, a zirconium oxide, a hafnium oxide, and a tantalum oxide can be used as a metal oxide, and nitrides and oxynitrides of these metals may be also used. These metal oxides and the like, which can be made thicker without increase in driving voltage, are preferable as described above.

Further reduction in damage during forming the second electrode 102 can be expected by making the fourth layer 128 thicker.

According to the present invention, which provides the thus described structure of the light-emitting element, reflection of light from the light-emitting element at the first electrode 101 or the second electrode 102 can be reduced, and a color filter 105 makes it possible to prevent wavelengths other than a luminescent color from the light-emitting element from being transmitted. Accordingly, the contrast can be enhanced by adjusting only light from the light-emitting element, and a light-emitting device that requires no polarization plate or the like can be provided.

Embodiment Mode 5

In the present embodiment mode, the cross-sectional structure of a pixel will be described, where a transistor that controls supply of current to a light-emitting element (referred to as a driving transistor) is a p-channel TFT. It is to be noted that a case where a first electrode and a second electrode respectively serve as an anode and a cathode will be descried in the present embodiment mode.

Figure 5:
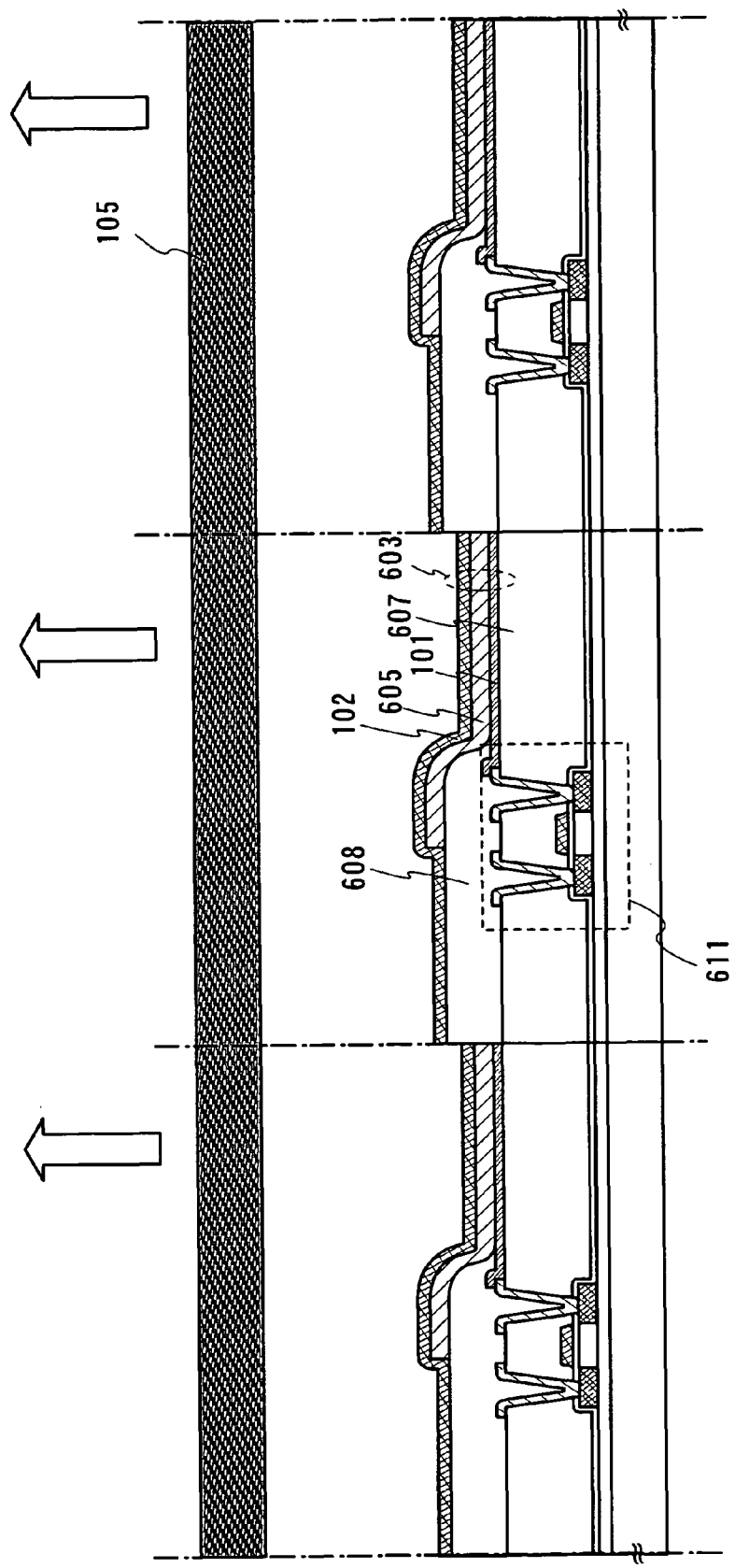
FIG. 5 is a cross-sectional view illustrating a light-emitting device according to the present invention.

FIG. 5 shows a cross-sectional view of three pixels, where a TFT 611 is a p-channel transistor, and light emitted from a light-emitting element 603 is extracted from a second electrode 102 side (top emission). In FIG. 5, a first electrode 101 of the light-emitting element 603 and the TFT 611 are electrically connected to each other. Further, an electroluminescent layer 605 adjacent to the first electrode 101 and a second electrode 102 adjacent to the electroluminescent layer 605 are stacked in order. The electroluminescent layer 605 includes the first to third layers 111 to 113 described above, and further includes the fourth layer 128. From this electroluminescent layer, light that has a peak wavelength in the visible region in an emission spectrum is emitted.

The TFT 611 has a channel forming region formed with the use of a separated island-shaped semiconductor film that is 10 to 200 nm in thickness. For the semiconductor film, any of an amorphous semiconductor film, a crystalline semiconductor film, a microcrystalline semiconductor film may be used. For example, in the case of a crystalline semiconductor film, an amorphous semiconductor film is formed first, and a crystalline semiconductor film crystallized by heat treatment can be used. For the heat treatment, a heating furnace, laser irradiation, irradiation with light emitted from a lump (hereinafter, referred to as lamp anneal) instead of laser light, or a combination thereof can be used.

In the case of using laser irradiation, a continuous-wave laser (CW laser) or a pulsed-oscillation laser (pulsed laser) can be used.

Further, the laser incident angle may be made to be $\theta$ ($0°<\theta<90°$) with respect to the semiconductor film. The result is that laser interference can be prevented.

It is to be noted that laser light of a continuous-wave fundamental wave and laser light of a continuous-wave harmonic may be used for laser irradiation, or laser light of a continuous-wave fundamental wave and laser light of a pulsed-oscillation harmonic may be used for laser irradiation. Plural laser light irradiation makes it possible to cover energy.

Alternatively, in the case of using a pulsed-oscillation laser, laser light is emitted at an oscillation frequency to provide a continuously-grown crystal grain in a scanning direction, where the oscillation frequency is a frequency at which a semiconductor film can be irradiated the next pulsed laser light between melting of the semiconductor film by laser light and solidification thereof. In short, a pulsed beam that is emitted at an oscillation frequency with a lower limit can be used in such a way that the period of pulsed oscillation is shorter than the time from melting of a semiconductor film to complete solidification thereof. The oscillation frequency of a pulsed beam that can be actually used is 10 MHz or more, and a frequency band much higher than a usually-used frequency band of several ten to several hundred Hz is used.

As another crystallization method by heat treatment, in the case of using a heating furnace, there is a method of heating an amorphous semiconductor film at 500 to 550° C. for 2 to 20 hours. In this case, the temperature is controlled preferably by multistep regulation in the 500 to 550° C. range so as to gradually get higher. Since hydrogen and the like in the semiconductor film are released in the initial heating process at a lower temperature, film roughness by crystallization can be reduced, and further, a dangling bond can be terminated. Moreover, it is preferable to provide a metal element that promotes crystallization, for example, Ni, on the amorphous semiconductor film since the heating temperature can be made lower. Even in the case of crystallization using this metal element, the semiconductor film may be heated to 600 to 950° C.

However, in the case of providing the metal element, there is fear that adverse effects are caused on electrical characteristics. Therefore, it is necessary to perform a gettering process for reducing or removing the metal element. For example, a process of capturing the metal element with an amorphous semiconductor film as a gettering sink may be performed.

Further, the TFT 611 has a gate insulating film covering the semiconductor film and a gate electrode of stacked first and second conductive films, and an insulating film containing hydrogen is provided on the gate electrode. A dangling bond can be terminated also by the hydrogen.

The TFT 611 is a p-channel transistor, and has a single-drain structure in which the semiconductor film includes only a higher-concentration impurity region. Alternatively, the TFT 611 may have an LDD (Lightly Doped Drain) structure in which a semiconductor film includes a lower-concentration impurity region and a higher-concentration impurity region. It is to be noted that the TFT 611 may have a GOLD structure in which a lower-concentration impurity region is overlapped with a gate electrode.

The TFT 611 is covered with an interlayer insulating film 607, and a partition 608 with an opening is formed on the interlayer insulating film 607. A portion of the first electrode 101 is exposed at the opening of the partition 608, and the first electrode 101, the electroluminescent layer 605, and the second electrode 102 are stacked in order at the opening.

The electroluminescent layer 605 corresponds to the first layer 111, the second layer 112, the third layer 113, and additionally the fourth layer 128, and the film thickness thereof is determined so that reflection of a luminescent color from the electroluminescent layer 605 at the first electrode 101 is reduced. In addition, when a mixed layer including an organic compound and a metal oxide is used for these layers, increase in driving voltage due to the film made thicker can be prevented.

Since the top emission type is employed, the first electrode 101 has no light-transmitting property whereas the second electrode 102 has a light-transmitting property. For these materials, it is possible to refer to the embodiment mode described above.

The electroluminescent layer 605 has a layer that generates holes, a layer that generates electrons, and the like in addition to a light-emitting layer as described above. Since the first electrode 101 serves as an anode, a layer that generates holes, a light-emitting layer, and a layer that generates electrons are in this order stacked from the first electrode 101 side. It is to be noted that a layer that generates electrons, a light-emitting layer, and a layer that generated holes are in this order stacked when the first electrode 101 serves as a cathode.

In the case of the pixels shown in FIG. 5, light emitted from the light-emitting element 603 can be extracted from the second electrode 102 side as indicated by an outline arrow. Further, reflection of the light at the first electrode 101 is reduced. Specifically, the film thickness of the electroluminescent layer 605 is determined so that reflection at the first electrode 101 is reduced.

Moreover, the color filter 105 provided on the second electrode side makes it possible to prevent wavelengths other than a luminescent color from the light-emitting element from being transmitted, namely, the color filter 105 is able to make a wavelength of the luminescent color from the light-emitting element transmit selectively. Accordingly, the contrast and the like can be controlled by adjusting only light from the electroluminescent layer, and further, the structure according to the present invention can provide a light-emitting device requires no polarization plate or the like.

Embodiment Mode 6

Next, a cross-sectional view of three pixels will be described with reference to FIG. 6, where a TFT 611 is a p-channel transistor, and light emitted from a light-emitting element 603 is extracted from a first electrode 101 side (bottom emission).

Figure 6:
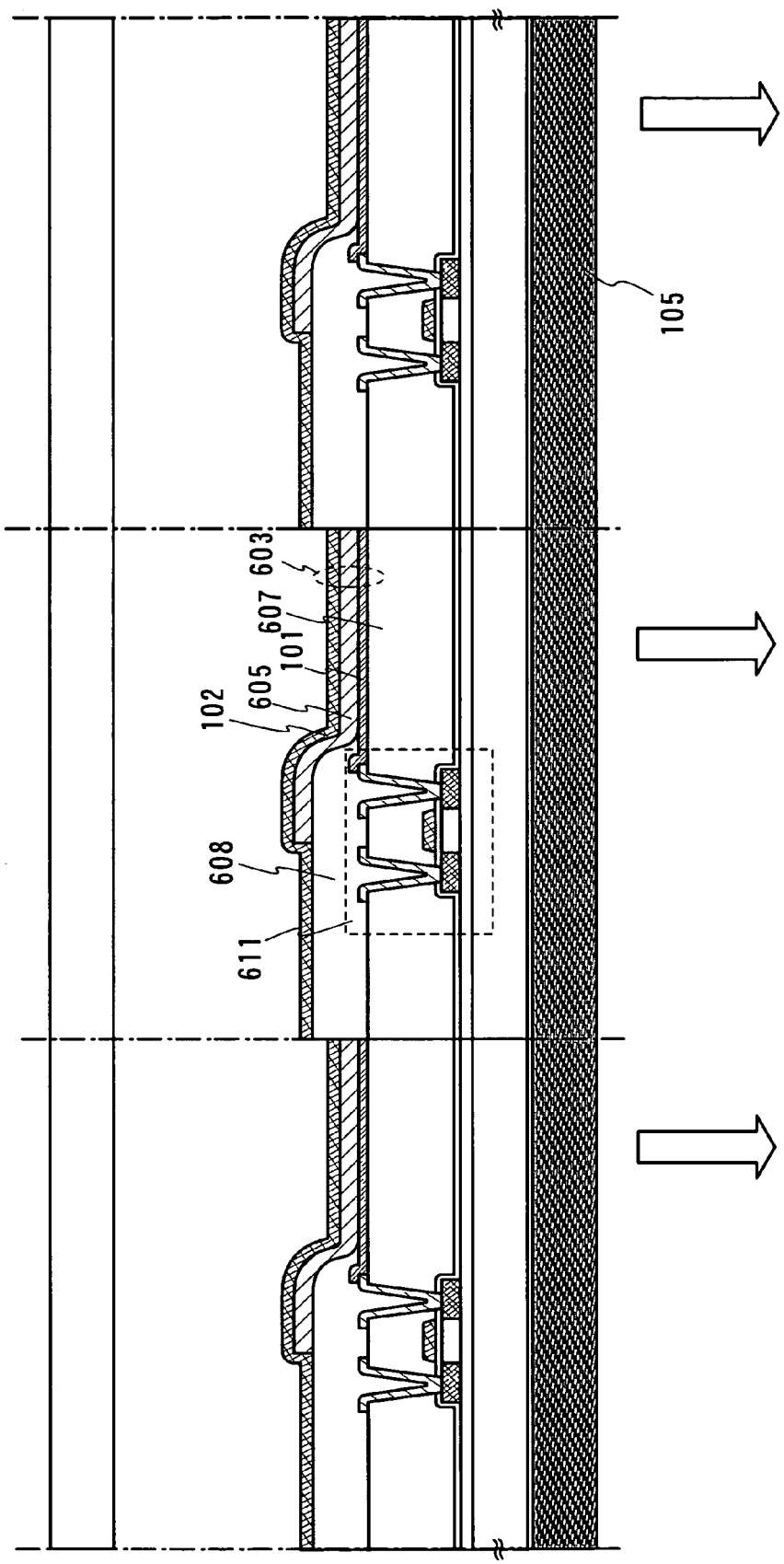
FIG. 6 is a cross-sectional view illustrating a light-emitting device according to the present invention.

In FIG. 6, the first electrode 101 of the light-emitting element 603 and the TFT 611 are electrically connected to each other. Further, an electroluminescent layer 605 and a second electrode 102 are stacked in order over the first electrode 101.

The TFT 611 can be formed in the same way as in the embodiment mode described above. In addition, since the bottom emission type is employed, the first electrode 101 has a light-transmitting property whereas the second electrode 102 has no light-transmitting property. For these materials, it is possible to refer to the embodiment mode described above. Further, a color filter 105 is provided on the first electrode 101 side to which light is emitted.

The electroluminescent layer 605 can be formed also in the same way as in the embodiment mode described above. However, a layer that generated electrons, a light-emitting layer, and a layer that generates holes are stacked preferably in this order in the present embodiment mode since the first electrode 101 serves as a cathode. Further, the film thicknesses of the first to third layers 111 to 113 and additionally the fourth layer 128 are determined so that reflection of a luminescent color from the electroluminescent layer 605 at the second electrode 102 can be reduced. Since FIG. 6 shows a case of a bottom-emission type, it is preferable in the electroluminescent layer 605 to determine the film thickness of a layer corresponding to the third layer 113 that is closer to the second electrode 102.

In the case of the pixels shown in FIG. 6, light emitted from the light-emitting element 603 can be extracted from the first electrode 101 side as indicated by an outline arrow, reflection at the second electrode 102 can be reduced, and a color filter 105 makes it possible to prevent wavelengths other than a luminescent color from the light-emitting element from being transmitted. Accordingly, the contrast can be enhanced by adjusting only light from the electroluminescent layer, and a light-emitting device that requires no polarization plate or the like can be provided.

Embodiment Mode 7

In the present embodiment mode, an equivalent circuit diagram of a pixel including a light-emitting element will be described with reference to FIGS. 7A to 7D.

Figure 7A:
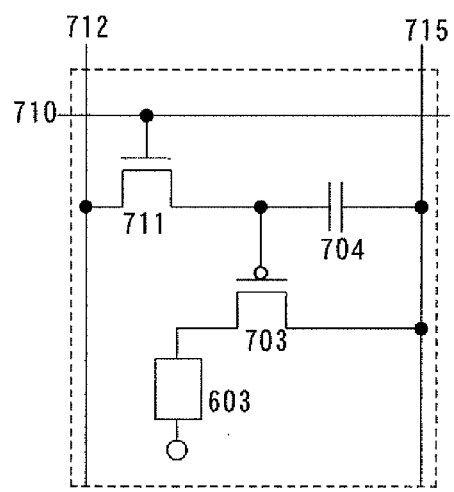
FIGS. 7A to 7D are pixel circuit diagrams for a light-emitting device according to the present invention.

FIG. 7A shows an example of an equivalent circuit for a pixel, which includes a signal line 712, a power supply line 715, and a scan line 710, and at an intersecting portion thereof, a light-emitting element 603, transistors 703 and 711, and a capacitor 704.

In this equivalent circuit, a video signal is input to the signal line 712 from a signal line driving circuit. The transistor 711 is able to control supply of the potential of the video signal to a gate of the transistor 703 in accordance with a selection signal that is input to the scan line 710, and is referred to as a switching transistor. The transistor 703 is able to control supply of current to the light-emitting element 603 in accordance with the potential of the video signal, and is referred to as a driving transistor. The light-emitting element 603 goes into an emitting state or non-emitting state in accordance with supplied current, which makes it possible to display images. The capacitor 704 is able to hold a voltage between the gate and source of the transistor 703. It is to be noted that, although the capacitor 704 is shown in FIG. 4A, it is not necessary that the capacitor 704 be provided when the gate capacitance of the transistor 703 or another parasitic capacitance is enough.

Figure 7B:
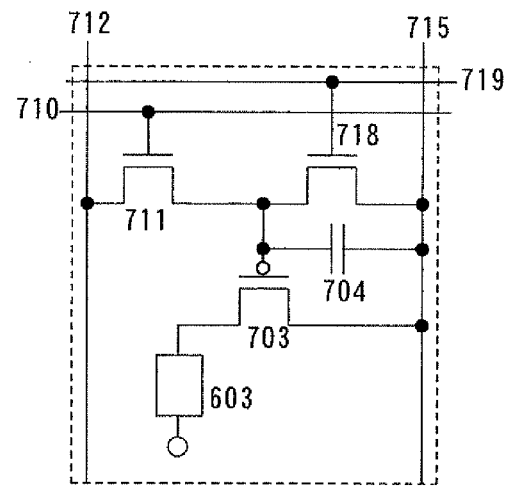

FIG. 7B is an equivalent circuit diagram of a pixel where a transistor 718 and a scan line 719 are additionally provided to the pixel shown in FIG. 7A.

The transistor 718 makes it possible to make the potentials of the gate and source of the transistor 703 equal to each other so that a state in which no current flows into the light-emitting element 603 can be forcibly made, and is referred to as an erasing transistor. Therefore, in time gray scale display, the next image signal can be input before inputting image signals into all pixels, and the duty ratio can be thus made higher.

Alternatively, an element that functions as a diode may be provided instead of the transistor 718. In the present embodiment mode, a diode-junction transistor or a pn-junction diode can be provided between the gate electrode of the transistor 703 and the scan line 719. Then, a state in which no current flows into the light-emitting element 603 can be forcibly made.

Figure 7C:
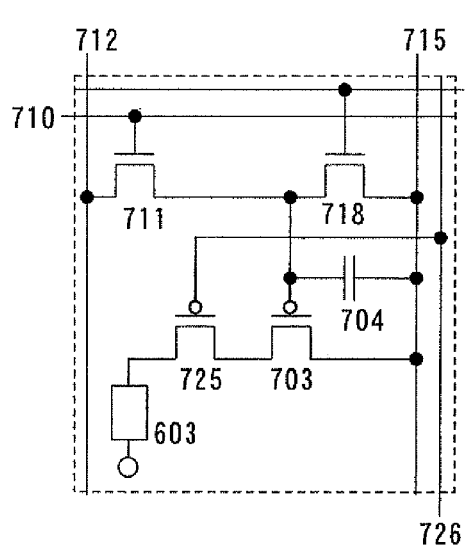

FIG. 7C is an equivalent circuit diagram of a pixel where a transistor 725 and a wiring 726 are additionally provided to the pixel shown in FIG. 7B. The gate of the transistor 725 has a fixed potential. For example, the potential of the gate is fixed by connecting the gate to the wiring 726. In addition, the transistors 703 and 725 are connected in series between the power supply line 715 and the light-emitting element 603. Therefore, in FIG. 7C, the transistor 725 is able to control the value of current supplied to the light-emitting element 603 whereas the transistor 703 is able to control whether or not the current is supplied to the light-emitting element 603.

The equivalent circuits of the pixels shown in FIGS. 7A to 7C can be driven by a digital method. In the case of driving by a digital method, some variations in electrical characteristics of each driving transistor are negligible, if any, since the transistors are used as switching elements.

Figure 7D:
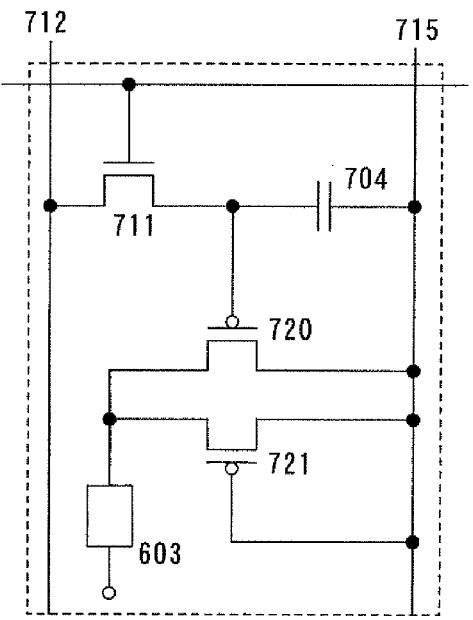

An equivalent circuit for a pixel of a light-emitting device according to the present invention can be driven by either a digital method or an analog method. For example, an equivalent circuit for a pixel shown in FIG. 7D includes a signal line 712, a power supply line 715, and a scan line 710, and at an intersecting portion thereof, a light-emitting element 603, transistors 711, 720, 721, and a capacitor 704. In FIG. 7D, the transistors 720 and 721 constitute a current mirror circuit, which is composed of p-channel transistors. In this equivalent circuit for a pixel, in the case of a digital method, a digital video signal is input from the signal line 712, and the value of current supplied to the light-emitting element 603 is controlled in accordance with a time gray scale. Alternatively, in the case of an analog method, an analog video signal is input from the signal line 712, and the value of current supplied to the light-emitting element 603 is controlled in accordance with the value of the analog video signal. In the case of driving by the analog method, lower power consumption can be achieved.

In each pixel described above, signals are input to the signal line 712, the power supply line 715, and the wiring 726 from a signal line driving circuit. In addition, signals are input to the scan lines 710 and 719 from a scan line driving circuit. One or more signal line driving circuits and one or more scan line driving circuits can be provided. For example, first and second scan line driving circuits can be provided with a pixel portion interposed therebetween.

In addition, in the pixel shown in FIG. 7A, a state in which no current flows into the light-emitting element 603 can be forcibly made as described with reference to FIG. 7B. For example, the transistor 711 is selected by a first scan line driving circuit at the moment when the light-emitting element 603 lights up, and a signal for forcibly applying no current into the light-emitting element 603 is supplied to the scan line 710 by a second scan line driving circuit. The signal for forcibly applying no current (Write Erase Signal) is a signal for applying a potential so that first and second electrode 101 and 102 of the light-emitting element have the same potential. In this way, a state in which no current flows into the light-emitting element 603 can be forcibly made, and the duty ratio can be thus made higher.

As described above, various types of equivalent circuits can be employed for a pixel of a light-emitting device according to the present invention. It is to be noted that the pixel circuit according to the present invention is not limited to the structures described in the present embodiment mode, and the present embodiment can be freely combined with the embodiment modes described above.

Embodiment Mode 8

Electronic devices provided with a light-emitting device according to the present invention include a television set (also, simply referred to as a TV or a television receiver), a digital camera, a digital video camera, a cellular phone unit (also, simply referred to as a mobile-phone unit or a cellular phone), a mobile information terminal such as PDA, a portable game machine, a monitor for a computer, a computer, a sound reproduction device such as a in-car audio system, an image reproduction device provided with a recording medium such as a home-use game machine, and the like. Specific examples thereof will be described with reference to FIGS. 8A to 8F.

Figure 8A:
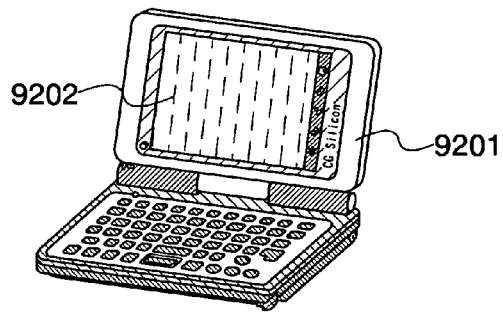
FIGS. 8A to 8F are diagrams illustrating electronic devices to which a light-emitting device according to the present invention is applied.

A mobile terminal device shown in FIG. 8A includes a main body 9201, a display portion 9202, and the like. A light-emitting device according to the present invention can be applied to the display portion 9202. Accordingly, it is possible to provide a mobile terminal device that is able to enhance the contrast thereof and requires no polarization plate or the like.

Figure 8B:
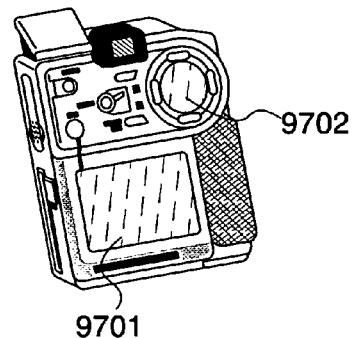

A digital video camera shown in FIG. 8B includes a display portion 9701, a display portion 9702, and the like. A light-emitting device according to the present invention can be applied to the display portion 9701. Accordingly, it is possible to provide a digital video camera that is able to enhance the contrast thereof and requires no polarization plate or the like.

Figure 8C:
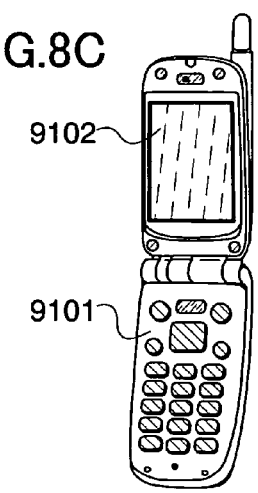

A cellular phone shown in FIG. 8C includes a main body 9101, a display portion 9102, and the like. A light-emitting device according to the present invention can be applied to the display portion 9102. Accordingly, it is possible to provide a cellular phone that is able to enhance the contrast thereof and requires no polarization plate or the like.

Figure 8D:
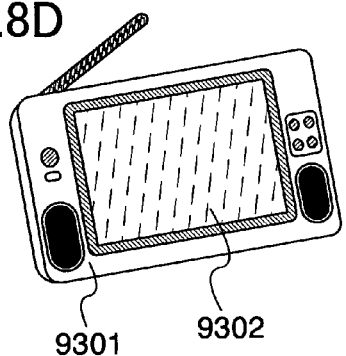

A portable television set shown in FIG. 8D includes a main body 9301, a display portion 9302, and the like. A light-emitting device according to the present invention can be applied to the display portion 9302. Accordingly, it is possible to provide a portable television set that is able to enhance the contrast thereof and requires no polarization plate or the like. In addition, the light-emitting device according to the present invention can be applied to various types of portable television sets such as a small-sized television incorporated in a mobile terminal such as a cellular phone handset and a medium-sized television that is portable.

Figure 8E:
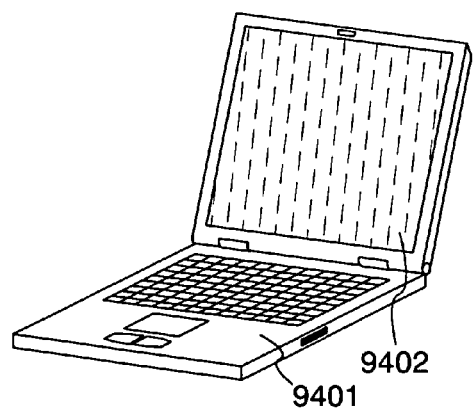

A portable computer shown in FIG. 8E includes a main body 9401, a display portion 9402, and the like. A light-emitting device according to the present invention can be applied to the display portion 9402. Accordingly, it is possible to provide a portable computer that is able to enhance the contrast thereof and requires no polarization plate or the like.

Figure 8F:
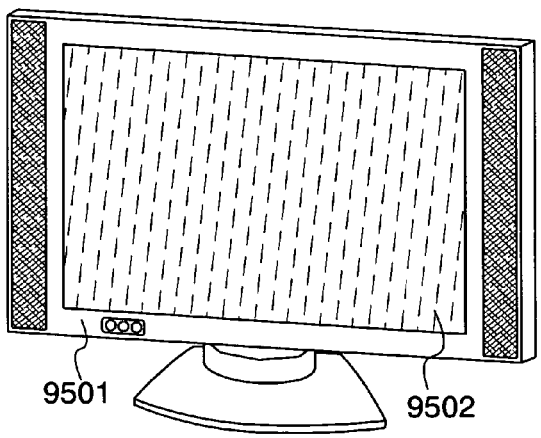

A television set shown in FIG. 8F includes a main body 9501, a display portion 9502, and the like. A light-emitting device according to the present invention can applied to the display portion 9502. Accordingly, it is possible to provide a television set that is able to enhance the contrast thereof and requires no polarization plate or the like.

As described above, a light-emitting device according to the present invention makes it possible to provide a mobile terminal device that is able to enhance the contrast thereof and requires no polarization plate or the like.

Embodiment 1

The present embodiment shows actual measurement values, calculated values, and the like of the reflectivities or transmittances of wavelengths from 400 to 800 nm.

Figure 9:
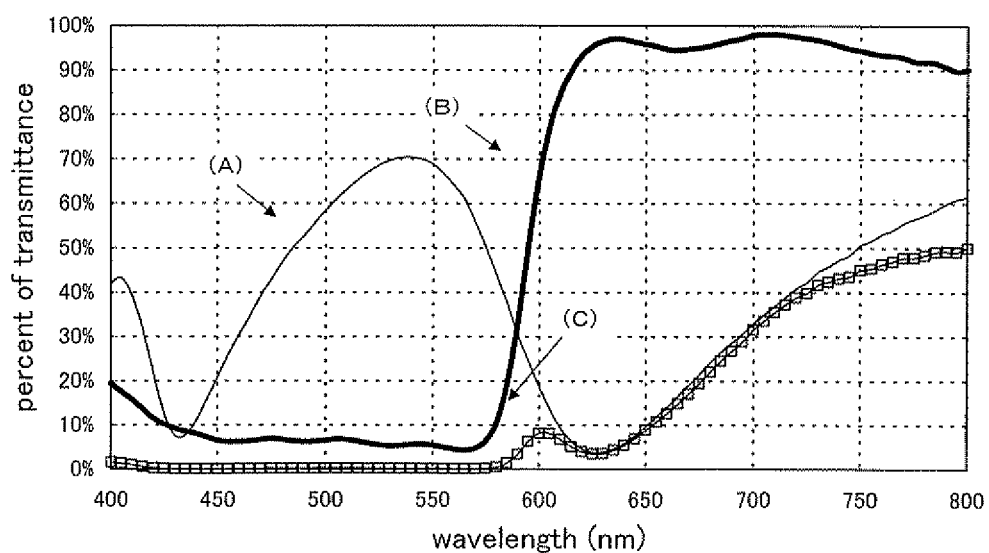
FIG. 9 is results for an electrode reflectivity of a red light-emitting element.

FIG. 9 shows a result of using a red color filter for providing a red color. The element has a structure in which titanium (Ti) as a first electrode, a mixed layer (196 nm thick) including organic compounds (α-NPD and rubrene) and a molybdenum oxide, α-NPD 10 nm thick, a layer (40 nm thick) in which a red luminescent material is dispersed in $Alq_3$, $Alq_3$ 20 nm thick, a layer (20 nm thick) including BzOS and lithium (Li), and aluminum (Al 15 nm thick) as a second electrode are stacked in order. It is to be noted that it is enough for the titanium to have a film thickness through which no light is transmitted, which is 40 nm or more.

Curve (A) shows calculated values of reflectivity at the first electrode, from which it is determined that the reflectivity has the lowest value around 630 nm, which corresponds to an emission spectrum from the light-emitting element. Curve (B) shows actual measurement values of transmittance of the red color filter (film thickness: 1.5 μm). It is determined from Curve (B) that the transmittance has the highest value around 630 nm, which corresponds to an emission spectrum from the light-emitting element. Curve (B) shows values obtained by multiplying the reflectivity (Curve (A)) by the transmittance (Curve (B)) squared, which are obtained for considering reflection of outside light in an actual light-emitting device. This is because outside light passes through the color filter, is reflected at the first electrode, passes trough the color filter again, and is recognized by a user. It is determined from Curve (C) that the reflectivity is small enough around 630 nm, which corresponds to an emission spectrum from the light-emitting element. Specifically, reflectance of the light emitting element at the peak wavelength (around 630 nm) is 10% or less.

Figure 10:
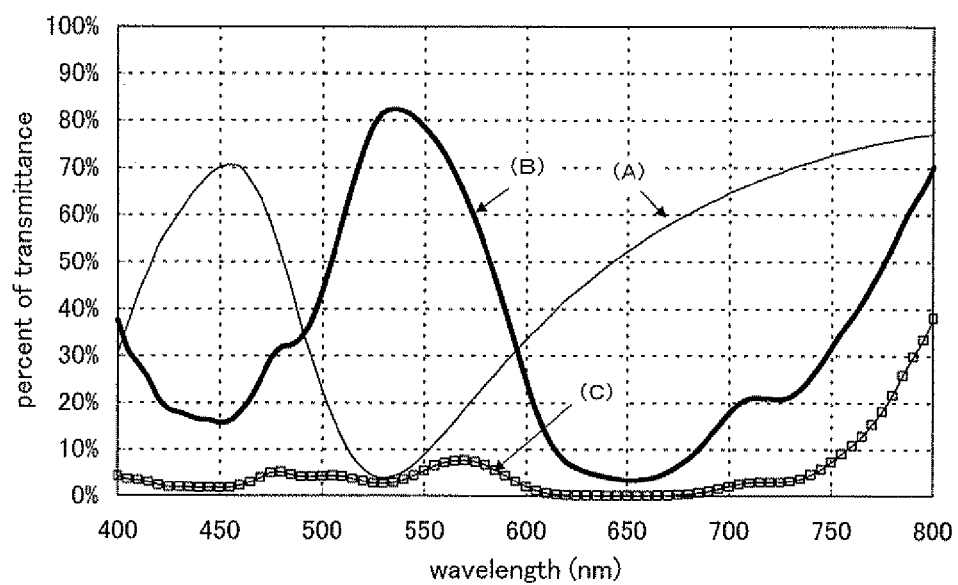
FIG. 10 is results for an electrode reflectivity of a green light-emitting element.

Further, FIG. 10 shows a result of using a green color filter for providing a green color. The element using the same materials, which has a structure in which titanium (Ti) as a first electrode, a mixed layer (140 nm thick) including organic compounds (α-NPD and rubrene) and a molybdenum oxide, α-NPD 10 nm thick, a layer (40 nm thick) in which a green luminescent material is dispersed in $Alq_3$, $Alq_3$ 20 nm thick, a layer (20 nm thick) including BzOS and lithium (Li), and aluminum (Al 15 nm thick) as a second electrode are stacked in order, is different from the red element described above in the film thickness of the mixed layer including the organic compounds (α-NPD and rubrene) and the molybdenum oxide. It is to be noted that it is enough for the titanium to have a film thickness through which no light is transmitted, which is 40 nm or more.

Curve (A) shows calculated values of reflectivity at the first electrode. It is determined that the reflectivity has the lowest value around 530 nm, which corresponds to an emission spectrum from the light-emitting element. Curve (B) shows actual measurement values of transmittance of the green color filter (film thickness: 1.5 μm). It is determined from Curve (B) that the transmittance has the highest value around 530 nm, which corresponds to an emission spectrum from the light-emitting element. Curve (B) shows values obtained by multiplying the reflectivity (Curve (A)) by the transmittance (Curve (B)) squared. It is determined from Curve (C) that the reflectivity is small enough around 530 nm, which corresponds to an emission spectrum from the light-emitting element. Specifically, reflectance of the light emitting element at the peak wavelength (around 530 nm) is 10% or less.

Figure 11:
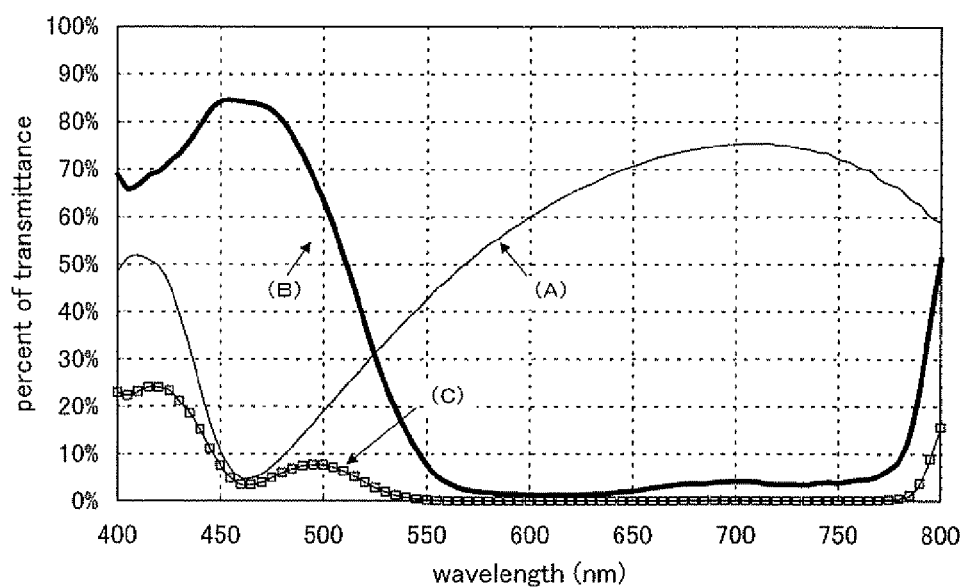
FIG. 11 is results for an electrode reflectivity of a blue light-emitting element.

Further, FIG. 11 shows a result of using a blue color filter for providing a blue color. The element using the same materials, which has a structure in which titanium (Ti) as a first electrode, a mixed layer (95 mm thick) including organic compounds (α-NPD and rubrene) and a molybdenum oxide, α-NPD 10 nm thick, t-BuDNA 40 nm thick, $Alq_3$ 20 nm thick, a layer (20 nm thick) including BzOS and lithium (Li), and aluminum (Al 15 nm thick) as a second electrode are stacked in order, is different from the red and green elements described above in the film thickness of the mixed layer including the organic compounds (α-NPD and rubrene) and the molybdenum oxide. It is to be noted that it is enough for the titanium to have a film thickness through which no light is transmitted, which is 40 nm or more.

Curve (A) shows calculated values of reflectivity at the first electrode. It is determined that the reflectivity has the lowest value around 450 nm, which corresponds to an emission spectrum from the light-emitting element. Curve (B) shows actual measurement values of transmittance of the blue color filter (film thickness: 1.5 μm). It is determined from Curve (B) that the transmittance has the highest value around 450 nm, which corresponds to an emission spectrum from the light-emitting element. Curve (B) shows values obtained by multiplying the reflectivity (Curve (A)) by the transmittance (Curve (B)) squared. It is determined from Curve (C) that the reflectivity is small enough around 450 nm, which corresponds to an emission spectrum from the light-emitting element. Specifically, reflectance of the light emitting element at the peak wavelength (around 450 nm) is 10% or less.

This light-emitting element makes it possible to reduce reflection of a desired emission wavelength at the first electrode, and the color filter, which has a high transmittance to the emission wavelength from the light-emitting element, is able to absorb wavelengths of the other light. Accordingly, it is possible to consider only light from the light-emitting element, and contrast control can be thus made simpler. Further, according to the present invention, a top-emission light-emitting device that requires no polarization plate or the like can be provided.

Although the reflectivity of the first electrode is considered in the present embodiment, the reflectivity of the second electrode can be also considered in the same way. Contrast control can be made simpler by considering the reflectivity of the second electrode and determining the film thickness of the light-emitting element, and a bottom-emission light-emitting device that requires no polarization plate or the like can be thus provided.

Based on this simulation result, the film thickness of an electroluminescent layer can be determined with respect to a first or second electrode. In fact, a light-emitting device can be manufactured by measuring the reflectivity of an emission wavelength from a light-emitting element at a first or second electrode, measuring the transmittance of a desired color filter, and increasing the transmission of the emission wavelength from the light-emitting element.

Although the present invention has been fully described by way of example with reference to the accompanying drawings, it is to be understood that various changes and modifications will be apparent to those skilled in the art. Therefore, unless such changes and modifications depart from the scope of the present invention hereinafter defined, they should be construed as being included therein.

What is claimed is:

1. A light-emitting device comprising:
a color filter;
a substrate over the color filter;
a semiconductor film over the substrate;
an insulating film over the semiconductor film;
a first electrode over and in direct contact with the insulating film, the first electrode being electrically connected to the semiconductor film;
an electroluminescent layer over and in direct contact with the first electrode; and
a second electrode over the electroluminescent layer comprising first and second layers and a light emitting layer;
wherein the second electrode is in contact with the electroluminescent layer,
wherein the first electrode comprises a light-transmitting material,
wherein a thickness of the light emitting layer is arranged to suppress reflection of an emission wavelength from the light emitting layer at the second electrode,
wherein the first layer is in contact with the first electrode,
wherein a metal oxide and an organic compound are mixed in the first layer, and
wherein a reflectance of light emitted from the light emitting layer at the second electrode is 10% or less.

2. A light-emitting device comprising:
a color filter;
a substrate over the color filter;
a semiconductor film over the substrate;
an insulating film over the semiconductor film;
a first electrode over the insulating film, the first electrode being electrically connected to the semiconductor film;
an electroluminescent layer over and in direct contact with the first electrode; and
a second electrode over the electroluminescent layer;
wherein the second electrode is in contact with the electroluminescent layer,
wherein the first electrode comprises a light-transmitting material,
wherein at least one of first, second, and third layers in the electroluminescent layer has a thickness arranged to reduce reflection of an emission wavelength from the electroluminescent layer at the second electrode,
wherein a metal oxide and an organic compound are mixed in the one of the first, second, and third layers, and
wherein a reflectance of light emitted from the electroluminescent layer at the second electrode is 10% or less.

3. A light-emitting device comprising:
a color filter;
a substrate over the color filter;
a semiconductor film over the substrate;
an insulating film over the semiconductor film;
a first electrode over the insulating film, the first electrode being electrically connected to the semiconductor film;
an electroluminescent layer over and in direct contact with the first electrode, the electroluminescent layer comprising a first layer, a second layer over the first layer, a third layer over the second layer; and
a second electrode over the electroluminescent layer;
wherein the second electrode is in contact with the electroluminescent layer,
wherein the first electrode comprises a light-transmitting material,
wherein the first layer has a thickness arranged to reduce reflection of an emission wavelength from the electroluminescent layer at the second electrode,
wherein a metal oxide and an organic compound are mixed in one of the first, second, and third layers, and
wherein a reflectance of light emitted from the electroluminescent layer at the second electrode is 10% or less.

4. A light-emitting device comprising:
a color filter;
a substrate over the color filter;
a semiconductor film over the substrate;
an insulating film over the semiconductor film;
a first electrode over the insulating film, the first electrode being electrically connected to the semiconductor film;
an electroluminescent layer over and in contact with the first electrode; and
a second electrode over the electroluminescent layer;
wherein the second electrode is in contact with the electroluminescent layer,
wherein the first electrode comprises a light-transmitting material,
wherein at least one of first and second layers and a light emitting layer comprised in the electroluminescent layer has a thickness arranged to reduce reflection of an emission wavelength from the light emitting layer at the second electrode,
wherein the first layer is in contact with the first electrode,
wherein a metal oxide and an organic compound are mixed in the first layer,
wherein a reflectance of light emitted from the light emitting layer at the second electrode is 10% or less, and
wherein visible light having at least peak wavelength is configured to pass through the color filter.

5. A light-emitting device comprising:
a color filter;
a substrate over the color filter;
a semiconductor film over the substrate;
an insulating film over the semiconductor film;
a first electrode over the insulating film;
an electroluminescent layer over and in contact with the first electrode, the first electrode being electrically connected to the semiconductor film; and
a second electrode over the electroluminescent layer;
wherein the second electrode is in contact with the electroluminescent layer,
wherein the first electrode comprises a light-transmitting material,
wherein at least one of first and second layers and a light emitting layer in the electroluminescent layer has a thickness arranged to reduce reflection of an emission wavelength from the electroluminescent layer at the second electrode,
wherein the first layer is in contact with the first electrode,
wherein a metal oxide and an organic compound are mixed in the first layer,
wherein a reflectance of light emitted from the light emitting layer at the second electrode is 10% or less,
wherein visible light having at least peak wavelength is configured to pass through the color filter, and
wherein the light emitting layer is configured to emit monochromatic light.

6. A light-emitting device comprising:
a color filter;
a substrate over the color filter;
a semiconductor film over the substrate;
an insulating film over the semiconductor film;
a first electrode over the insulating film;
an electroluminescent layer over and in contact with the first electrode, the first electrode being electrically connected to the semiconductor film; and a second electrode over the electroluminescent layer;
wherein the second electrode is in contact with the electroluminescent layer,
wherein the first electrode comprises a light-transmitting material,
wherein the electroluminescent layer comprises first, second, third layers and a fourth layer,
wherein the fourth layer has a thickness arranged to reduce a reflectance of an emission wavelength from the electroluminescent layer at the second electrode to 10% or less,
wherein the fourth layer is in contact with the second electrode,
wherein a metal oxide and an organic compound are mixed in at least the fourth layer,
wherein visible light having at least peak wavelength is configured to pass through the color filter, and
wherein the electroluminescent layer is configured to emit monochromatic light.

7. The light-emitting device according to claim 6, wherein the metal oxide is selected from the group consisting of a vanadium oxide, a molybdenum oxide, a niobium oxide, a rhenium oxide, a tungsten oxide, a ruthenium oxide, a titanium oxide, a chromium oxide, a zirconium oxide, a hafnium oxide, and a tantalum oxide.

8. The light-emitting device according to claim 1, further comprising a first substrate being the substrate and a second substrate with the first and second electrodes between the first and second substrates, wherein Anti-Reflection treatment coating is performed to at least one of the first and second substrates.

9. The light-emitting device according to claim 2, further comprising a first substrate being the substrate and a second substrate with the first and second electrodes between the first and second substrates, wherein Anti-Reflection treatment coating is performed to at least one of the first and second substrates.

10. The light-emitting device according to claim 3, further comprising a first substrate being the substrate and a second substrate with the first and second electrodes between the first and second substrates, wherein Anti-Reflection treatment coating is performed to at least one of the first and second substrates.

11. The light-emitting device according to claim 4, further comprising a first substrate being the substrate and a second substrate with the first and second electrodes between the first and second substrates, wherein Anti-Reflection treatment coating is performed to at least one of the first and second substrates.

12. The light-emitting device according to claim 5, further comprising a first substrate being the substrate and a second substrate with the first and second electrodes between the first and second substrates, wherein Anti-Reflection treatment coating is performed to at least one of the first and second substrates.

13. The light-emitting device according to claim 6, further comprising a first substrate being the substrate and a second substrate with the first and second electrodes between the first and second substrates, wherein Anti-Reflection treatment coating is performed to at least one of the first and second substrates.

14. The light-emitting device according to claim 7, further comprising a first substrate being the substrate and a second substrate with the first and second electrodes between the first and second substrates, wherein Anti-Reflection treatment coating is performed to at least one of the first and second substrates.

15. The light-emitting device according to claim 1, wherein the second electrode comprises a reflective material.

16. The light-emitting device according to claim 2, wherein the second electrode comprises a reflective material.

17. The light-emitting device according to claim 3, wherein the second electrode comprises a reflective material.

18. The light-emitting device according to claim 4, wherein the second electrode comprises a reflective material.

19. The light-emitting device according to claim 5, wherein the second electrode comprises a reflective material.

20. The light-emitting device according to claim 6, wherein the second electrode comprises a reflective material.

21. The light-emitting device according to claim 7, wherein the second electrode comprises a reflective material.

22. The light-emitting device according to claim 1,
wherein the second electrode is in direct contact with the light emitting layer.

23. The light-emitting device according to claim 2,
wherein at least one of a protective film, a gate insulating film, and a wiring provided between the first electrode and the substrate are considered to suppress the reflection.

24. A light-emitting device comprising:
a first light-emitting element exhibiting a red light emitting wavelength;
a second light-emitting element exhibiting a green light emitting wavelength;
a third light-emitting element exhibiting a blue light emitting wavelength;
a first color filter that a light emitted from the first light-emitting element goes through;
a second color filter that a light emitted from the second light-emitting element goes through;
a third color filter that a light emitted from the third light-emitting element goes through;
the first light-emitting element comprising:
a first anode comprising a reflective material;
a first cathode opposed to the first anode and comprising a light-transmitting material;
a first layer provided at the first anode side between the first anode and the first cathode;
the second light-emitting element comprising:
a second anode comprising a reflective material;
a second cathode opposed to the second anode and comprising comprises a light-transmitting material;
a second layer provided at the second anode side between the second anode and the second cathode;
the third light-emitting element comprising:
a third anode comprising a reflective material;
a third cathode opposed to the third anode and comprising a light-transmitting material;
a third layer provided at the third anode side between the third anode and the third cathode;
wherein each of the first, second, and third layers is a layer in which an organic compound comprising a material that exhibits an hole transporting property and a metal oxide comprising a material that exhibits an electron accepting property to the material that exhibits the hole transporting property are mixed,
wherein the first layer is the thickest of the first, second, and third layers.

25. The light-emitting device according to claim 24,
wherein the first layer is thicker than the second layer, and
wherein the second layer is thicker than the third layer.

26. The light-emitting device according to claim 24, wherein the metal oxide is selected from the group consisting of a vanadium oxide, a molybdenum oxide, a niobium oxide, a rhenium oxide, a tungsten oxide, a ruthenium oxide, a titanium oxide, a chromium oxide, a zirconium oxide, a hafnium oxide, and a tantalum oxide.

* * * * *

UNITED STATES PATENT AND TRADEMARK OFFICE
CERTIFICATE OF CORRECTION

PATENT NO.         : 8,633,473 B2                                        Page 1 of 1
APPLICATION NO.    : 11/318783
DATED              : January 21, 2014
INVENTOR(S)        : Takeshi Noda et al.

It is certified that error appears in the above-identified patent and that said Letters Patent is hereby corrected as shown below:

In the Specification:

Column 9, Line 63; Change "122" to --124--.

Column 22, Line 6; Change "(95 mm thick)" to --(95 nm thick)--.

Signed and Sealed this
Twenty-seventh Day of May, 2014

Michelle K. Lee
*Deputy Director of the United States Patent and Trademark Office*